(12) United States Patent
Grobis et al.

(10) Patent No.: US 11,031,435 B2
(45) Date of Patent: Jun. 8, 2021

(54) MEMORY DEVICE CONTAINING OVONIC THRESHOLD SWITCH MATERIAL THERMAL ISOLATION AND METHOD OF MAKING THE SAME

(71) Applicant: Western Digital Technologies, Inc., San Jose, CA (US)

(72) Inventors: Michael Grobis, Campbell, CA (US); Joyeeta Nag, San Jose, CA (US); Derek Stewart, Livermore, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/442,858

(22) Filed: Jun. 17, 2019

(65) Prior Publication Data

US 2020/0395410 A1    Dec. 17, 2020

(51) Int. Cl.
| | |
|---|---|
| H01L 27/24 | (2006.01) |
| H01F 10/32 | (2006.01) |
| H01L 45/00 | (2006.01) |
| H01L 27/22 | (2006.01) |
| H01L 43/02 | (2006.01) |
| H01L 43/10 | (2006.01) |

(52) U.S. Cl.
CPC ..... *H01L 27/2427* (2013.01); *H01F 10/3254* (2013.01); *H01L 27/224* (2013.01); *H01L 27/2463* (2013.01); *H01L 43/02* (2013.01); *H01L 45/06* (2013.01); *H01L 45/08* (2013.01); *H01L 45/1233* (2013.01); *H01L 45/143* (2013.01); *H01L 45/144* (2013.01); *H01L 45/1608* (2013.01); *H01F 10/3286* (2013.01); *H01L 43/10* (2013.01); *H01L 45/146* (2013.01); *H01L 45/147* (2013.01)

(58) Field of Classification Search
CPC . H01L 27/2427; H01L 45/143; H01L 45/144; H01L 45/1608
USPC ........................................................ 257/5
See application file for complete search history.

(56) References Cited

U.S. PATENT DOCUMENTS

| | | |
|---|---|---|
| 8,351,250 B2 | 1/2013 | Lowrey |
| 8,486,743 B2 | 7/2013 | Bresolin et al. |
| 8,728,839 B2 | 5/2014 | Bresolin et al. |
| 9,118,004 B2 | 8/2015 | Bresolin et al. |
| 9,236,566 B2 | 1/2016 | Bresolin et al. |
| 9,252,362 B2 | 2/2016 | Pio |
| 9,257,647 B2 | 2/2016 | Borodulin et al. |
| 9,543,515 B2 | 1/2017 | Gealy et al. |
| 9,716,226 B2 | 7/2017 | Gealy et al. |

(Continued)

FOREIGN PATENT DOCUMENTS

WO    WO2019/005172 A1    1/2019

OTHER PUBLICATIONS

U.S. Appl. No. 15/844,005, filed Dec. 15, 2017, SanDisk Technologies LLC.

(Continued)

*Primary Examiner* — Didarul A Mazumder
(74) *Attorney, Agent, or Firm* — The Marbury Law Group PLLC

(57) ABSTRACT

A memory device includes a plurality of memory cells, and an isolation material portion located between the memory cells. The isolation material portion includes at least one ovonic threshold switch material portion.

12 Claims, 18 Drawing Sheets

(56) References Cited

U.S. PATENT DOCUMENTS

| | | | |
|---|---|---|---|
| 10,121,965 B1 | 11/2018 | Uno et al. | |
| 10,199,434 B1 | 2/2019 | Lee et al. | |
| 10,224,373 B2 | 3/2019 | Sel et al. | |
| 10,229,723 B1 | 3/2019 | Choi et al. | |
| 10,249,683 B1 | 4/2019 | Lille et al. | |
| 10,276,555 B2 | 4/2019 | Schafer | |
| 2012/0074367 A1* | 3/2012 | Costa | H01L 27/2481 257/2 |
| 2012/0241705 A1 | 9/2012 | Bresolin et al. | |
| 2013/0270504 A1 | 10/2013 | Bresolin et al. | |
| 2014/0217351 A1 | 8/2014 | Bresolin et al. | |
| 2015/0044849 A1* | 2/2015 | Pio | H01L 27/249 438/382 |
| 2015/0318470 A1 | 11/2015 | Bresolin et al. | |
| 2015/0325279 A1* | 11/2015 | Roizin | G11C 11/1675 365/158 |
| 2016/0133319 A1* | 5/2016 | Fantini | G11C 13/0004 365/163 |
| 2018/0096982 A1 | 4/2018 | Schafer et al. | |
| 2018/0211703 A1* | 7/2018 | Choi | G11C 13/003 |
| 2019/0006418 A1 | 1/2019 | Sel et al. | |
| 2019/0027201 A1 | 1/2019 | Petti et al. | |
| 2019/0067568 A1 | 2/2019 | Yamashita et al. | |
| 2019/0080738 A1 | 3/2019 | Choi et al. | |

OTHER PUBLICATIONS

U.S. Appl. No. 16/401,172, filed May 2, 2019, Western Digital Technologies, Inc.
U.S. Appl. No. 16/422,187, filed May 24, 2019, SanDisk Technologies LLC.
U.S. Appl. No. 16/432,356, filed Jun. 5, 2019, SanDisk Technologies LLC.
Notification of Transmittal of the International Search Report and Written Opinion of the International Search Authority for International Patent Application No. PCT/US2019/068887, dated Apr. 27, 2020, 17 pages.
Yeh, C.W. et al., "High endurance self-heating OTS-PCM pillar cell for 3D stackable memory," In 2018 IEEE Symposium on VLSI Technology, Jun. 18-22, 2018 (pp. 205-206). Jun. 22, 2018 (Jun. 22, 2018)—Abstract.
Yeh, C.W. et al., "High endurance self-heating OTS-PCM pillar cell for 3D stackable memory," In 2018 IEEE Symposium on VLSI Technology, Jun. 18-22, 2018 (pp. 205-206). Jun. 22, 2018 (Jun. 22, 2018).

* cited by examiner

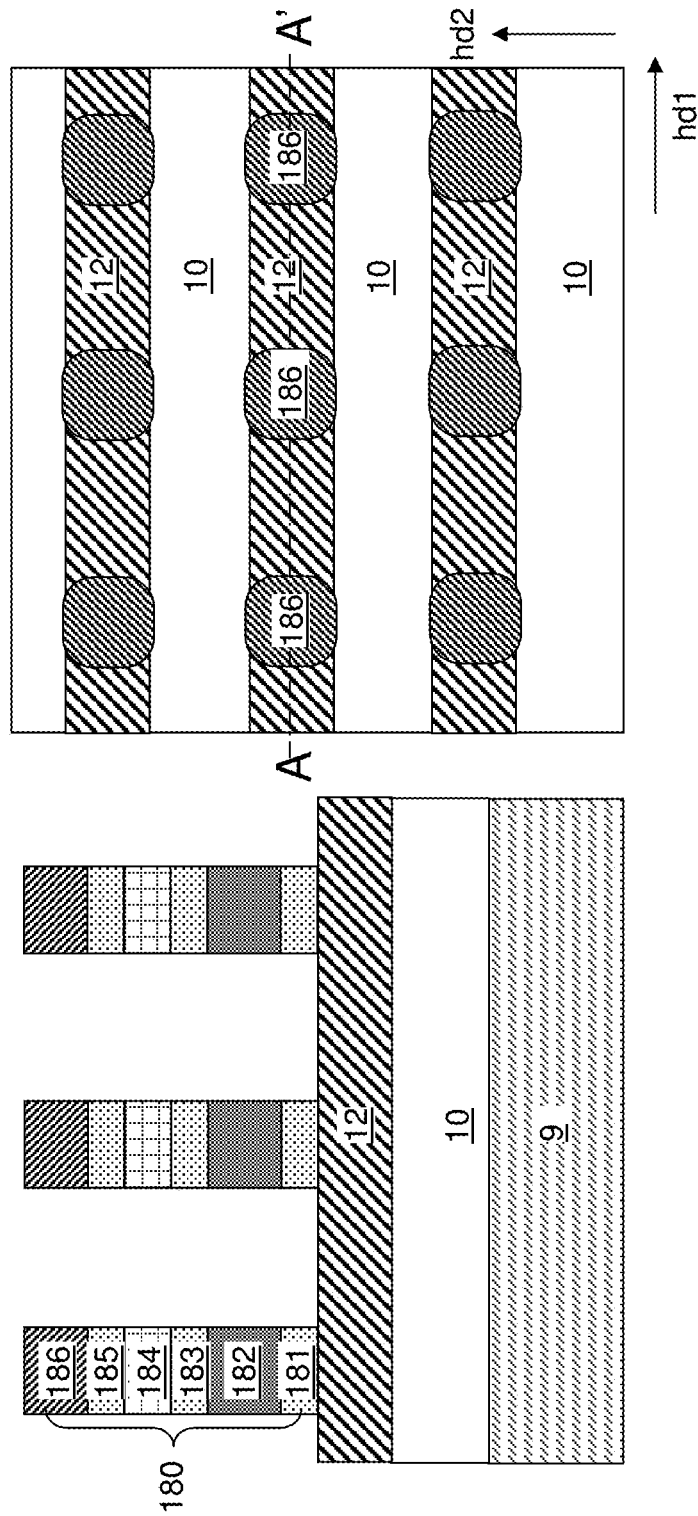

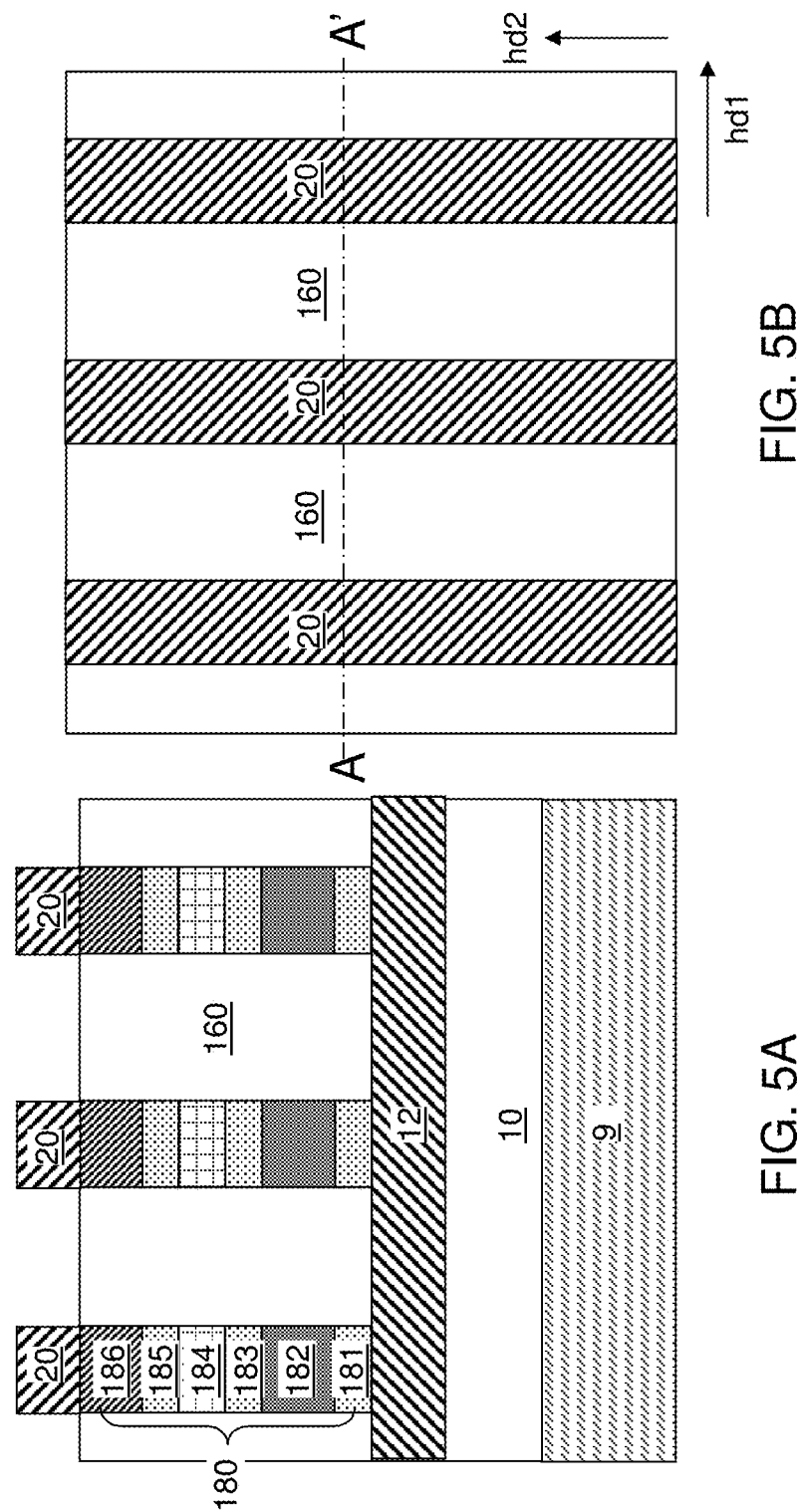

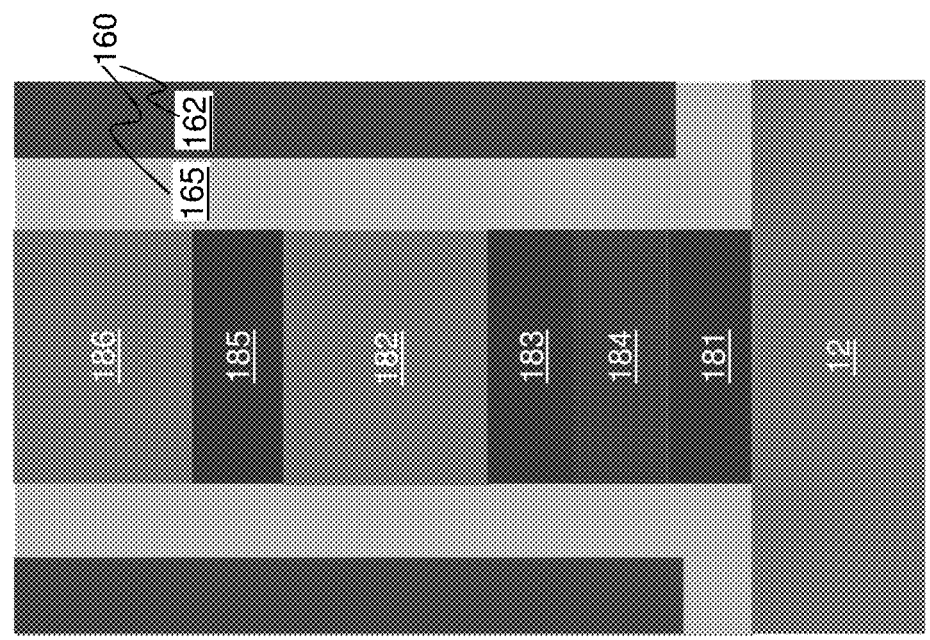
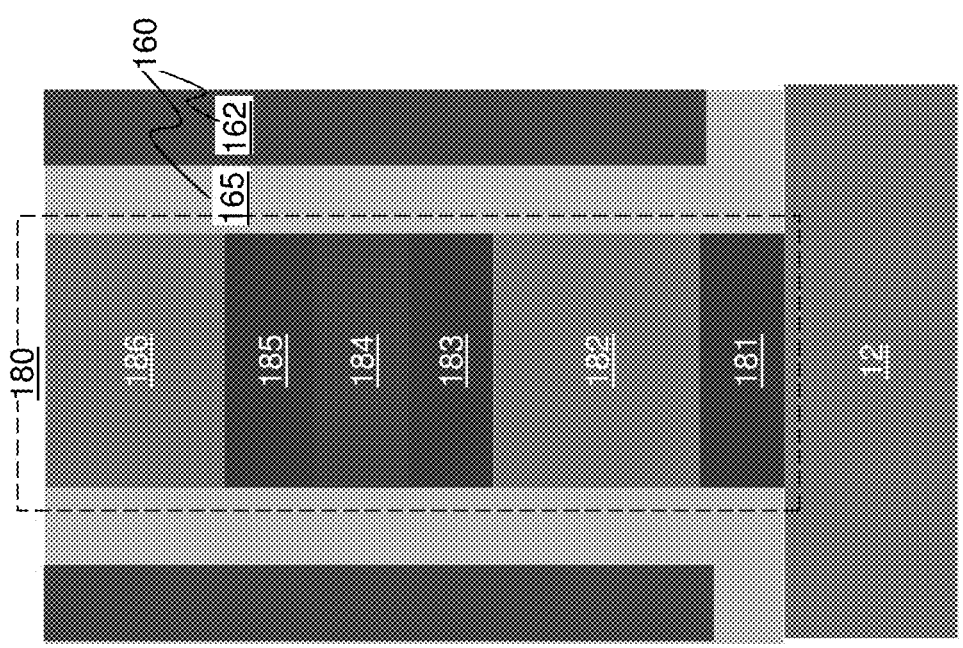
FIG. 8A
FIG. 8B

MEMORY DEVICE CONTAINING OVONIC THRESHOLD SWITCH MATERIAL THERMAL ISOLATION AND METHOD OF MAKING THE SAME

FIELD

The present disclosure relates generally to the field of semiconductor devices and specifically to a memory device including ovonic threshold switch material thermal isolation and methods of forming the same.

BACKGROUND

Many memory devices use thermal activation of a memory material to program and/or erase bits stored in a memory element. In this case, the memory element includes a memory material portion that can be thermally activated. An example of such a memory element is a phase change memory element. A phase change material (PCM) memory device (also known as a phase change random access memory "PCRAM" or "PRAM") is a type of non-volatile memory device that stores information as a resistivity state of a material that can be in different resistivity states corresponding to different phases of the material. The different phases can include an amorphous state having high resistivity and a crystalline state having low resistivity (i.e., a lower resistivity than in the amorphous state). The transition between the amorphous state and the crystalline state can be induced by controlling the rate of cooling after application of an electrical pulse that renders the phase change material amorphous in a first part of a programming process. The second part of the programming process includes control of the cooling rate of the phase change material. If rapid quenching occurs, the phase change material can cool into an amorphous high resistivity state. If slow cooling occurs, the phase change material can cool into a crystalline low resistivity state.

SUMMARY

According to an aspect of the present disclosure, a memory device includes a plurality of memory cells, and an isolation material portion located between the memory cells. The isolation material portion includes at least one ovonic threshold switch material portion.

According to another embodiment of the present disclosure, a method of forming a memory device is provided, which comprises: forming first electrically conductive lines laterally extending along a first horizontal direction over a substrate; forming a two-dimensional array of memory pillar structures on the first electrically conductive lines; forming an isolation material portion including a combination of a dielectric material layer and at least one ovonic threshold switch material portion around the two-dimensional array of memory pillar structures, wherein a segment of the dielectric material layer and a segment of the at least one ovonic threshold switch material portion are formed between each laterally-neighboring pair of memory pillar structures; and forming second electrically conductive lines laterally extending along a second horizontal direction directly on top surfaces of a respective subset of the two-dimensional array of memory pillar structures.

BRIEF DESCRIPTION OF THE DRAWINGS

FIG. 3A is a vertical cross-sectional view of the exemplary structure after formation of memory pillar structures according to an embodiment of the present disclosure.

FIG. 3B is a top-down view of the exemplary structure of FIG. 3A. The vertical plane A-A' is the plane of the vertical cross-sectional view of FIG. 3A.

FIG. 5A is a vertical cross-sectional view of the exemplary structure after formation of second conductive lines according to an embodiment of the present disclosure.

FIG. 5B is a top-down view of the exemplary structure of FIG. 5A. The vertical plane A-A' is the plane of the vertical cross-sectional view of FIG. 5A.

FIG. 8A is a vertical cross-sectional view of a fourth configuration of the exemplary structure according to an embodiment of the present disclosure.

FIG. 8B is a vertical cross-sectional view of a fifth configuration of the exemplary structure according to an embodiment of the present disclosure.

DETAILED DESCRIPTION

Figure 1A:
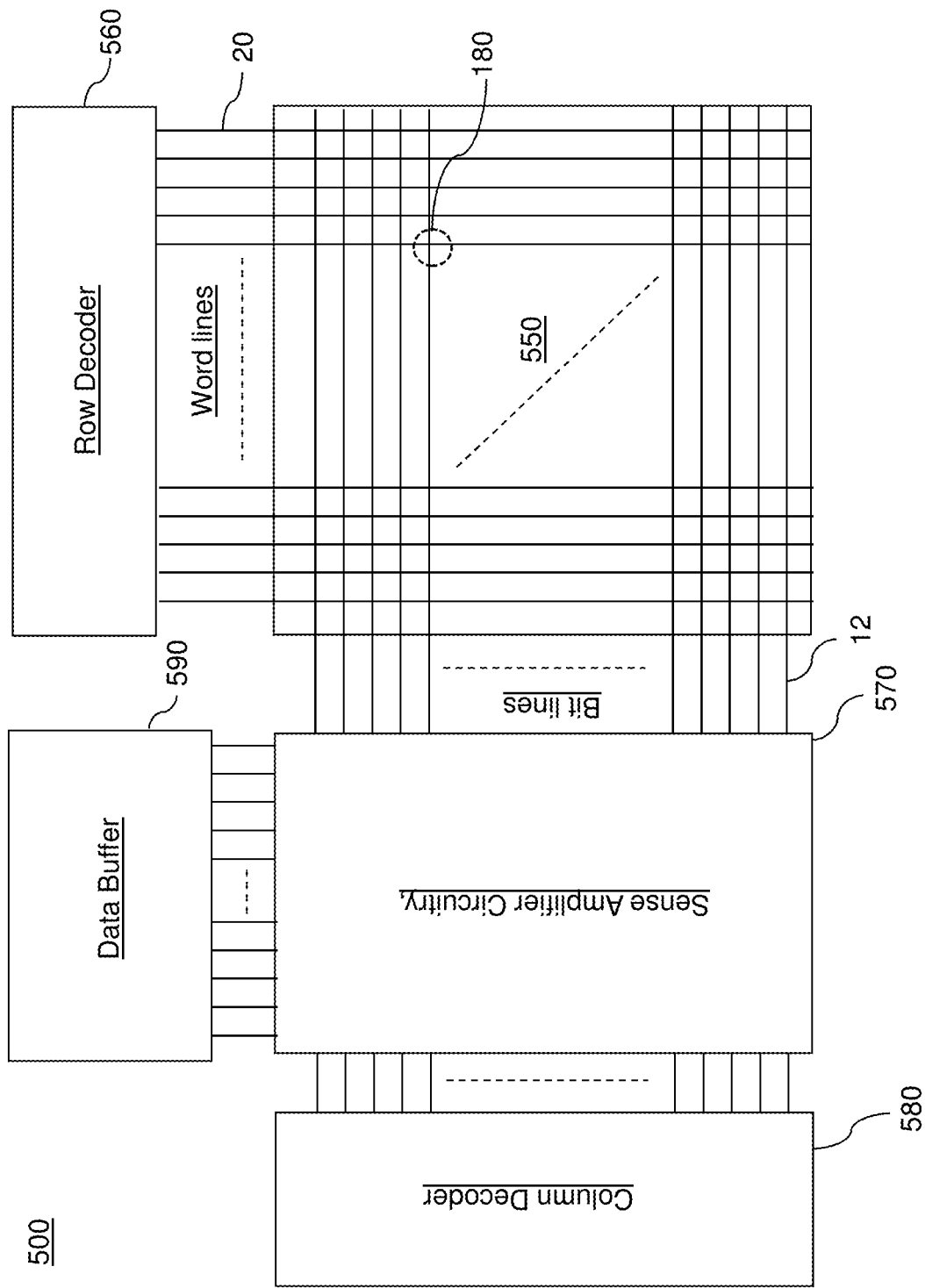
FIG. 1A is an exemplary circuit schematic of a memory device including a two-dimensional or a three-dimensional array of memory elements of one embodiment of the present disclosure.

A memory cell that uses thermal activation needs thermal isolation from neighboring memory cells to reduce or prevent disturbing (e.g., unintended programming and/or erasing) the neighboring memory cells. Generally, improvement in thermal isolation of a memory cell can provide enhancement in power efficiency and reduce write/programming disturb of neighboring memory cells.

Embodiments of the present disclosure are directed to a memory device including ovonic threshold switch material thermal isolation between memory cells and methods of forming the same, the various aspects of which are described below. The ovonic threshold switch material has a low thermal conductivity and provides an efficient thermal barrier structure that provides heat retention within each memory cell and cell-to-cell thermal isolation. The memory devices of embodiments of the present disclosure can be used in storage class memory systems. The memory devices of various embodiments may be resistive random access memory (ReRAM) devices, magnetoresistive random access memory (MRAM) devices or phase change material (PCM) memory devices.

For PCM memory devices, programming of a phase change material into a low (i.e., lower) resistivity crystalline state from a high (i.e., higher) resistivity amorphous state (i.e., a "SET" operation) can be difficult and energy-intensive. Crystallization of many phase change materials (such as germanium-antimony-telluride compound semiconductor materials) is nucleation-dominated. Nucleation of the phase change material into a crystalline state having large grain sizes becomes increasingly difficult as the volume size of phase change materials is reduced. This problem is exacerbated as the size of phase change memory cells decrease to dimensions less than 80 nm. Using a longer SET time or a growth-from-melt type SET operation may lead to slow write speed and high energy consumption in a phase change memory device, and thus, is not desirable. Embodiments of the present disclosure provide crystallization templates that improve the crystallization of the phase change material into the crystalline, low resistivity SET state, such as for example when the smallest dimension of the phase change memory cell is less than 80 nm, such as 25 to 80 nm.

The drawings are not drawn to scale. Multiple instances of an element may be duplicated where a single instance of the element is illustrated, unless absence of duplication of elements is expressly described or clearly indicated otherwise. Unless otherwise indicated, a "contact" between elements refers to a direct contact between elements that provides an edge or a surface shared by the elements. Ordinals such as "first," "second," and "third" are employed merely to identify similar elements, and different ordinals may be employed across the specification and the claims of the instant disclosure. A same reference numeral refers to a same element or a similar element. Unless otherwise noted, elements with a same reference numeral are presumed to have a same material composition. As used herein, all thermoelectric properties and thermal properties are measured at 300 degrees Kelvin unless otherwise specified. Consequently, the reference temperature (i.e., measurement temperature) for asymmetric thermoelectric heat generation and other thermoelectrical properties and thermal properties is 300 degrees Kelvin in the specification and in the claims unless expressly specified otherwise.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0–10^{5}$ S/cm in the absence of electrical dopants therein, and is capable of producing a doped material having electrical conductivity in a range from $1.0 \times 10^{-3}$ S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{2}$ S/cm. As used herein, an "insulating material" or a "dielectric material" refers to a material having electrical conductivity much less than $1.0 \times 10^{-3}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{2}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-3}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

FIG. 1A is a schematic diagram of a memory device 500. In one example described below, the memory device is a phase change material memory device. However, ReRAM and/or MRAM devices may be used instead. The memory device 500 includes memory cells which may be located in memory pillar structures 180 in an array configuration. As used herein, a phase change memory device refers to a memory device that employs a phase change material providing at least two resistivity states, such as a combination of a high (i.e., higher) resistivity amorphous state and a low (i.e., lower) resistivity crystalline (e.g., polycrystalline) state. The phase change memory device can be configured as a random access memory device. As used herein, a "random access memory device" refers to a memory device including memory cells that allow random access, i.e., access to any selected memory cell upon a command for reading the contents of the selected memory cell.

The memory device 500 of an embodiment of the present disclosure includes a memory array region 550 containing an array of memory pillar structures 180 located at the intersection of the respective word lines 20 and bit lines 12. The memory device 500 may also contain a row decoder 560 connected to the word lines 20, a programming and sensing circuitry 570 (e.g., a sense amplifier and other bit line control circuitry) connected to the bit lines 12, a column decoder 580 connected to the bit lines 12 and a data buffer 590 connected to the sense circuitry. Multiple instances of the memory pillar structures 180 are provided in an array configuration in the phase change memory device 500.

Figure 1B:
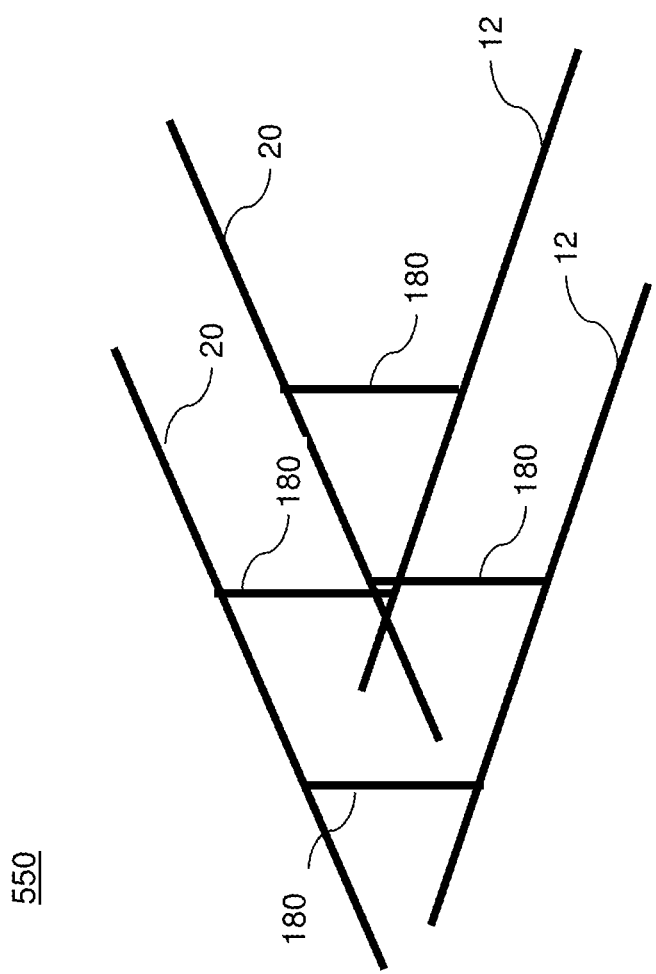
FIG. 1B is a schematic perspective view of a cross-point array of memory elements located between word lines and bit lines in the memory device of FIG. 1A.

FIG. 1B illustrates a cross-point array configuration for a group of memory pillar structures 180. Each memory pillar structure 180 includes a memory material, such as a phase change material or another material described below, having at least two different resistivity states. The memory material portion is provided between a first electrode, such as a first electrically conductive line 12, and a second electrode, such as a second electrically conductive line 20. A plurality of first electrically conductive lines 12 comprise a first set of parallel metal lines extending along a first horizontal direction (e.g., bit line direction), and a plurality of second electrically conductive lines 20 comprise a second set of parallel metal lines extending along a second horizontal direction (e.g., word line direction). The second horizontal direction may, or may not, be perpendicular to the first horizontal direction. In one embodiment, the first electrically conductive lines 12 may comprise the bit lines, and the second electrically conductive lines 20 may comprise the word lines. Alternatively, the first electrically conductive lines 12 may comprise the word lines, and the second electrically conductive lines 20 may comprise the bit lines.

Figures 2A, 2B:
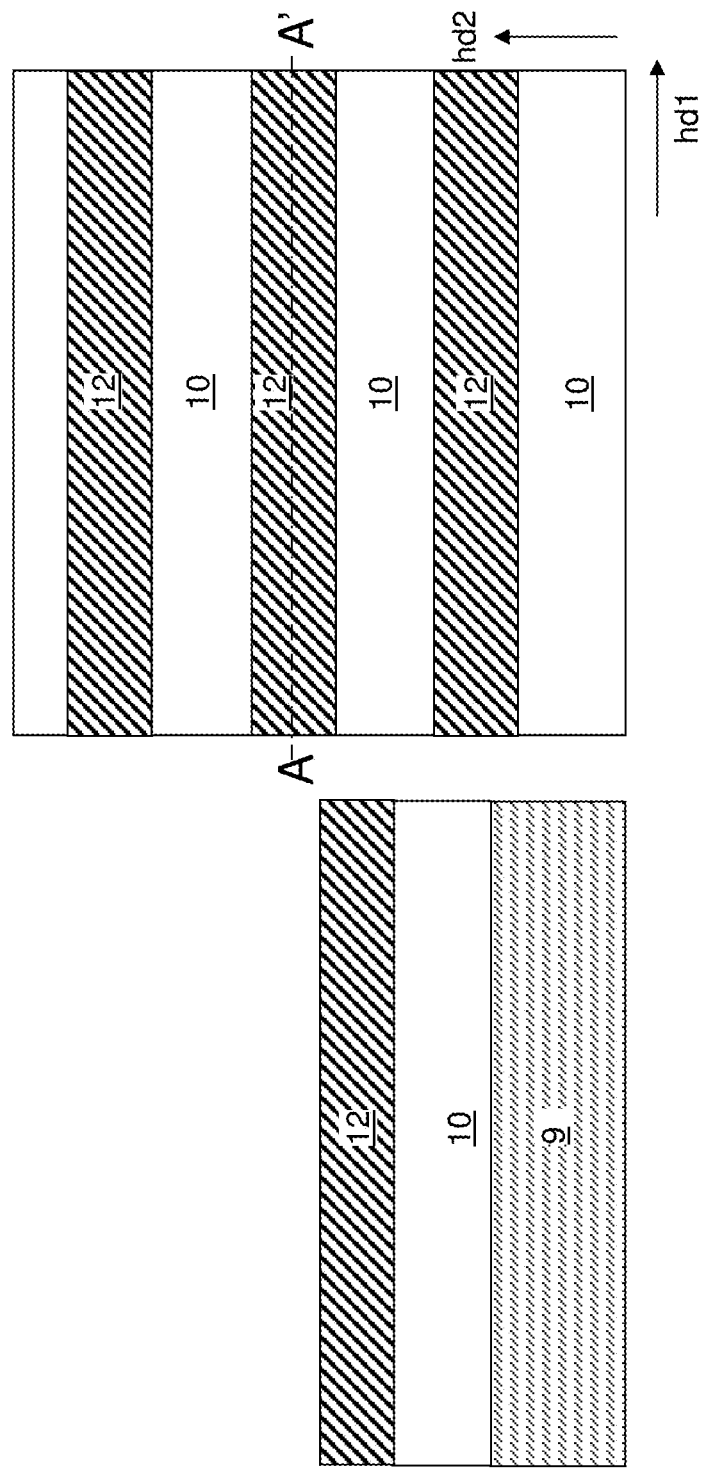
FIG. 2A is a vertical cross-sectional view of an exemplary structure for forming a memory device after formation of first electrically conductive lines according to an embodiment of the present disclosure.
FIG. 2B is a top-down view of the exemplary structure of FIG. 2A. The vertical plane A-A' is the plane of the vertical cross-sectional view of FIG. 2A.

Referring to FIGS. 2A and 2B, an exemplary structure for forming a memory device is illustrated. An insulating layer 10 can be formed over a top surface of a substrate 9. The substrate 9 can include a semiconductor material, an insulating material, or a conductive material. In one embodiment, the substrate 9 can be a commercially available semiconductor wafer, or a portion of a commercially available semiconductor wafer. In one embodiment, semiconductor devices such as field effect transistors (not shown) may be formed on a top surface of the substrate 9. The insulating layer 10 includes a dielectric material such as silicon oxide, silicon nitride, at least one dielectric metal oxide, or a combination thereof. In one embodiment, metal interconnect structures such as metal lines and metal vias (not shown) may be embedded in the insulating layer 10 to provide electrical connections among the semiconductor devices on the top surface of the substrate 9.

First electrically conductive lines 12 laterally extending along a first horizontal direction hd1 can be formed in an upper portion of the insulating layer 10. The first electrically conductive lines 12 may be formed, for example, by forming line trenches that laterally extend along a first horizontal direction in an upper portion of the insulating layer 10, and by depositing and planarizing at least one conductive material. The at least one conductive material may include a metallic liner material such as TiN, TaN, and/or WN and a metallic fill material such as W, Cu, Co, Mo, Ru, another metal, or an intermetallic ally. Alternatively, at least one conductive material can be deposited over a planar surface of the insulating material layer, and can be patterned to form the first electrically conductive lines 12. In this case, an additional insulating material can be deposited between the first electrically conductive lines 12, and can be subsequently planarized to provide top surfaces that are coplanar with the top surfaces of the first electrically conductive lines 12. The additional insulating material can be incorporated into the insulating layer 10.

In one embodiment, the first electrically conductive lines 12 may be formed as a periodic structure, i.e., as a one-dimensional periodic array of first electrically conductive lines 12. In this case, the first electrically conductive lines 12 can have a first uniform pitch along a second horizontal direction hd2 that is perpendicular to the first horizontal direction hd1. In one embodiment, the first electrically conductive lines 12 may have a same vertical cross-sectional shape within vertical planes that perpendicular to the first horizontal plane hd2. The thickness of each first electrically conductive line 12 can be in a range from 5 nm to 600 nm, such as from 20 nm to 100 nm, although lesser and greater thicknesses can also be employed. The width of each first electrically conductive line 12 can be in a range from 5 nm to 300 nm, such as from 20 nm to 100 nm, although lesser and greater widths can also be employed.

Referring to FIGS. 3A and 3B, a two-dimensional array of memory pillar structures 180 can be formed on the first electrically conductive lines 12. The two-dimensional array of memory pillar structures can be formed by depositing a material layer stack including at least a memory material layer and at least a selector material layer over the first electrically conductive lines 12 as planar material layers, and by patterning the material layer stack into the two-dimensional array of memory pillar structures 180. The shape and location of each memory pillar structure 180 can be selected such that a row of memory pillar structures 180 is formed on each first electrically conductive line 12. The two-dimensional array of memory pillar structures 180 may be formed as a rectangular periodic array. The horizontal cross-sectional shape of each memory pillar structure 180 may be rectangular, circular, elliptical, or of any generally curvilinear shape having a closed periphery. Patterning of the material layer stack into the two-dimensional array of memory pillar structures 180 can be performed, for example, by applying and patterning a photoresist layer over the material layer stack such that patterned portions of the photoresist layer cover a two-dimensional array, and by performing an anisotropic etch process that transfers the pattern in the photoresist portions through the material layer stack. The etch chemistry of the terminal step of the anisotropic etch process can be selective to the materials of the first electrically conductive lines 12. The photoresist portions can be subsequently removed, for example, by ashing.

Each patterned portion of the memory material layer constitutes a memory element (e.g., a memory cell) 182. In one embodiment, the memory material layer, and consequently each memory element 182, includes a memory material that provides at least two different resistivity states depending on programming conditions. In one embodiment, the memory material layer and the memory elements 182 can include ReRAM elements. The ReRAM elements may include a transition metal oxide material that provides different resistivity states through oxygen vacancy migration (such as hafnium oxide, tantalum oxide, tungsten oxide), a transition metal oxide material that functions as a reversible thermo-chemical fuse/antifuse (such as nickel oxide), an electrochemical migration-based programmable metallization material, which is also referred to as a conductive bridging or bridge material (such as copper-doped silicon dioxide glass, silver-doped germanium selenide, or silver-doped germanium sulfide), a tunnel barrier material (such as a memristor material, a Schottky barrier material, a barrier metal cell/vacancy-modulated conductive oxide material (such as titanium oxide), or a praseodymium-calcium-manganese oxide (PCMO) material) or a Mott transition-based metal-insulator transition (MIT) switching device material (such as vanadium oxide or niobium oxide). In another embodiment, the memory material layer and the memory elements 182 can include PCM memory elements, such as a phase change memory material (such as a chalcogenide alloy, e.g., a germanium-antimony-telluride compound), or a superlattice structure that exhibits multiple resistive states through interfacial effects (such as a superlattice of chalcogenide alloys).

In another embodiment, the memory material layer and the memory elements 182 can include MRAM elements, such as a tunneling magnetoresistance material (such as a thin magnesium oxide tunneling layer) located in a magnetic tunnel junction stack between ferromagnetic free and fixed (i.e., reference) layers. An exemplary MRAM memory layer may comprise a stack of a CoPt/CoFeB layered reference layer, a MgO tunneling barrier, and a CoFeB free layer. The thickness of the MRAM memory element 182 stack may be suitably selected, and may be in a range from 5 nm to 60 nm, such as from 10 nm to 30 nm, although lesser and greater thicknesses can also be employed. The MRAM memory element is capable of supporting two different configurations of the free layer magnetization direction relative to the reference layer magnetization, providing two different resistances for current flowing through the memory stack. The free layer magnetization direction can be switched to the low resistance state in which the free and reference layers are parallel, by flowing electrical current, consisting of electron carriers, of sufficient magnitude from the reference layer to the free layer. The free layer magnetization direction can be switched to the high resistance in which the free and reference layers are anti-parallel, by flowing electrical current, consisting of electron carriers, of sufficient magnitude from the free layer to the reference layer. The MRAM memory cell resistance is determined by flowing a lower current which does not disturb the resistance state, but provides sufficient signal-to-noise ratio to discern the resistance state.

In one embodiment, the memory elements 182 can include a phase change memory material. As used herein, a "phase change material" refers to a material having at least two different phases providing different resistivity. The at least two different phases can be provided, for example, by controlling the time-dependent temperature profile during a cooling step that follows a heated state to provide an amorphous state having a higher resistivity and a polycrystalline state having a lower resistivity. In this case, the higher resistivity state of the phase change material can be achieved by faster quenching of the phase change material after heating the polycrystalline material to an amorphous solid state and/or to a liquid state, and the lower resistivity state of the phase change material can be achieved by heating the amorphous material followed by controlled cooling of the phase change material from the amorphous state to the polycrystalline state. The phase change material acts as the memory material (i.e., data storage material).

Exemplary phase change materials include, but are not limited to, germanium antimony telluride (GST) compounds such as $Ge_2Sb_2Te_5$ or $GeSb_2Te_4$, germanium antimony compounds, indium germanium telluride compounds, aluminum selenium telluride compounds, indium selenium telluride compounds, and aluminum indium selenium telluride compounds. These compounds (e.g., compound semiconductor material) may be doped (e.g., nitrogen doped GST) or undoped. Thus, the phase change material layer can include, and/or can consist essentially of, a material selected from a germanium antimony telluride compound, a germanium antimony compound, an indium germanium telluride compound, an aluminum selenium telluride compound, an indium selenium telluride compound, or an aluminum indium selenium telluride compound. The thickness of the phase change material layer can be in a range from 5 nm to 600 nm, such as from 20 nm to 300 nm and/or from 40 nm to 150 nm, although lesser and greater thicknesses can also be employed.

Each patterned portion of the selector material layer constitutes a selector element 184. As used herein, a "selector material" refers to any material that can function as an on/off switch depending on the magnitude and/or the direction of an applied bias voltage across two or three terminals of the selector. In one embodiment, the selector elements 184 comprise three terminal devices, such as transistors in which the channel comprises the selector material. In this embodiment, additional transistor layers, such as a gate dielectric and gate electrode are provided. The gate dielectric and gate electrode may be located inside the stack of the memory pillar structure 180 or on a sidewall of the memory pillar structure 180. In another embodiment, the entire transistor may be located outside the memory pillar structure and electrically connected between one of the conductive lines (12, 20) and the memory element 182.

In another embodiment, the selector elements 184 comprise two terminal devices, such as devices that include a non-Ohmic material that provides electrical connection or electrical isolation depending on the magnitude and/or the polarity of an externally applied voltage bias thereacross. In one embodiment, the selector material layer includes at least one threshold switch material layer. The at least one threshold switch material layer includes any suitable threshold switch material which exhibits non-linear electrical behavior, such as an ovonic threshold switch (OTS) material or volatile conductive bridge. In another embodiment, the selector material layer includes at least one non-threshold switch material layer, such as a tunneling selector material or diode materials (e.g., materials for p-n semiconductor diode, p-i-n semiconductor diode, Schottky diode or metal-insulator-metal diode). As used herein, a threshold switch material, such as but not limited to an ovonic threshold switch material, refers to a material that displays a non-linear resistivity curve under an applied external bias voltage such that the resistivity of the material decreases with the magnitude of the applied external bias voltage. In other words, the threshold switch material is non-Ohmic, and becomes more conductive under a higher external bias voltage than under a lower external bias voltage. As used herein, an ovonic threshold switch is a device that includes a chalcogen containing OTS material layer which does not crystallize in a low resistivity state under a voltage above the threshold voltage, and reverts back to a high resistivity state when not subjected to a voltage above a critical holding voltage across the OTS material layer.

An ovonic threshold switch material (OTS material) can be non-crystalline (for example, amorphous) in a high resistivity state, and can remain non-crystalline (for example, remain amorphous) in a low resistivity state during application of a voltage above its threshold voltage across the OTS material. The OTS material can revert back to the high resistivity state when the high voltage above its threshold voltage is lowered below a critical holding voltage. Throughout the resistivity state changes, the ovonic threshold switch material can remain non-crystalline (e.g., amorphous). In one embodiment, the ovonic threshold switch material can comprise an amorphous chalcogenide material which exhibits hysteresis in both the write and read current polarities. The chalcogenide material may contain S, Se, and/or Te chalcogen material alloyed with Si, Ge, Sn, P, As, and/or Sb, and may be doped with B, C, N, O, and/or In. Exemplary ovonic threshold switch materials include SiTe, GeTe, GeSe, or GeSeAs, with atomic compositions for constituent elements ranging from 5 to 95%. The ovonic threshold switch material layer can contain any ovonic threshold switch material. In one embodiment, the ovonic threshold switch material layer can include a compound of at least one Group 14 elements and at least one Group 16 element. In one embodiment, the ovonic threshold switch material layer can include, and/or can consist essentially of, a material selected from a GeSeAs alloy (e.g., $Ge_{10}As_{35}Se_{55}$), a GeTeAs alloy, a GeSeTe alloy, a GeSe alloy, a SeAs alloy, a AsTe alloy, a GeTe alloy, a SiTe alloy (e.g., $Si_{20}Te_{80}$), a SiAsTe alloy, or SiAsSe alloy, with atomic compositions for constituent elements ranging from 5 to 95%.

In one embodiment, the material of the selector material layer can be selected such that the resistivity of the selector material therein decreases at least by two orders of magnitude (i.e., by more than a factor of 100) upon application of an external bias voltage that exceeds a critical bias voltage magnitude (also referred to as threshold voltage). In one embodiment, the composition and the thickness of the selector material layer can be selected such that the critical bias voltage magnitude can be in a range from 1 V to 6 V, although lesser and greater voltages can also be employed for the critical bias voltage magnitude. The thickness of the selector material layer can be, for example, in a range from 1 nm to 50 nm, such as from 5 nm to 25 nm, although lesser and greater thicknesses can also be employed.

The material layer stack can optionally include additional material layers that can be patterned into additional material portions within each memory pillar structure 180. For example, each memory pillar structure 180 may include a first spacer layer 181 located between a first electrically conductive line 12 and the memory element 182, an intermediate spacer layer 183 located between the memory element 182 and the selector element 184, and/or a second spacer layer 185 located above the selector element 184. Each of the first spacer layer 181, the intermediate spacer layer 183, and the second spacer layer 185 is optional, and may include a material having a suitable electrical conductivity and diffusion barrier property. In one embodiment, each of the first spacer layer 181, the intermediate spacer layer 183, and the second spacer layer 185 may include a material that retards diffusion of materials of the memory element 182 and/or the selector element 184 therethrough. For example, each of the each of the first spacer layer 181, the intermediate spacer layer 183, and the second spacer layer 185 can include amorphous carbon, a nitrogen-carbon alloy material, a conductive metallic nitride material (such as TiN, TaN, and/or WN), or an elemental metal (such as W) or an intermetallic alloy. The thickness of each of the first spacer layer 181, the intermediate spacer layer 183, and the second spacer layer 185 can be in a range from 1 nm to 30 nm, such as from 3 nm to 10 nm, although lesser and greater thicknesses can also be employed.

Optionally, the material layer stack can include a metallic material layer as a topmost layer. In this case, the metallic material layer can be patterned into metallic plates 186. Each metallic plate 186 overlies a memory element 182 and a selector element 184. In case a second spacer layer 185 is present within each memory pillar structure 180, a metallic plate 186 can contact a top surface of a second spacer layer 185. Each metallic plate 186 can include a metallic material such as tungsten, molybdenum, ruthenium, titanium, tantalum, TiN, TaN, or WN. The thickness of each metallic plate 186 may be in a range from 3 nm to 60 nm, such as from 6 nm to 30 nm, although lesser and greater thicknesses can also be employed. The maximum lateral dimension of each memory pillar structure 180 along the second horizontal direction hd2 can be the same as, or can be less than, the width of the first electrically conductive lines 12 along the second horizontal direction. The maximum lateral dimension of each memory pillar structure 180 along the first horizontal direction hd1 can be the same as, or can be less than, the width of second electrically conductive lines to be subsequently formed.

Generally, each memory pillar structure 180 within the two-dimensional array of memory pillar structures 180 comprises a memory element 182 comprising a memory material configured to provide at least two different states representing a respective bit, and a selector element 184 configured to provide a conductive state and an insulating state depending on a voltage differential thereacross.

Figures 4A, 4B:
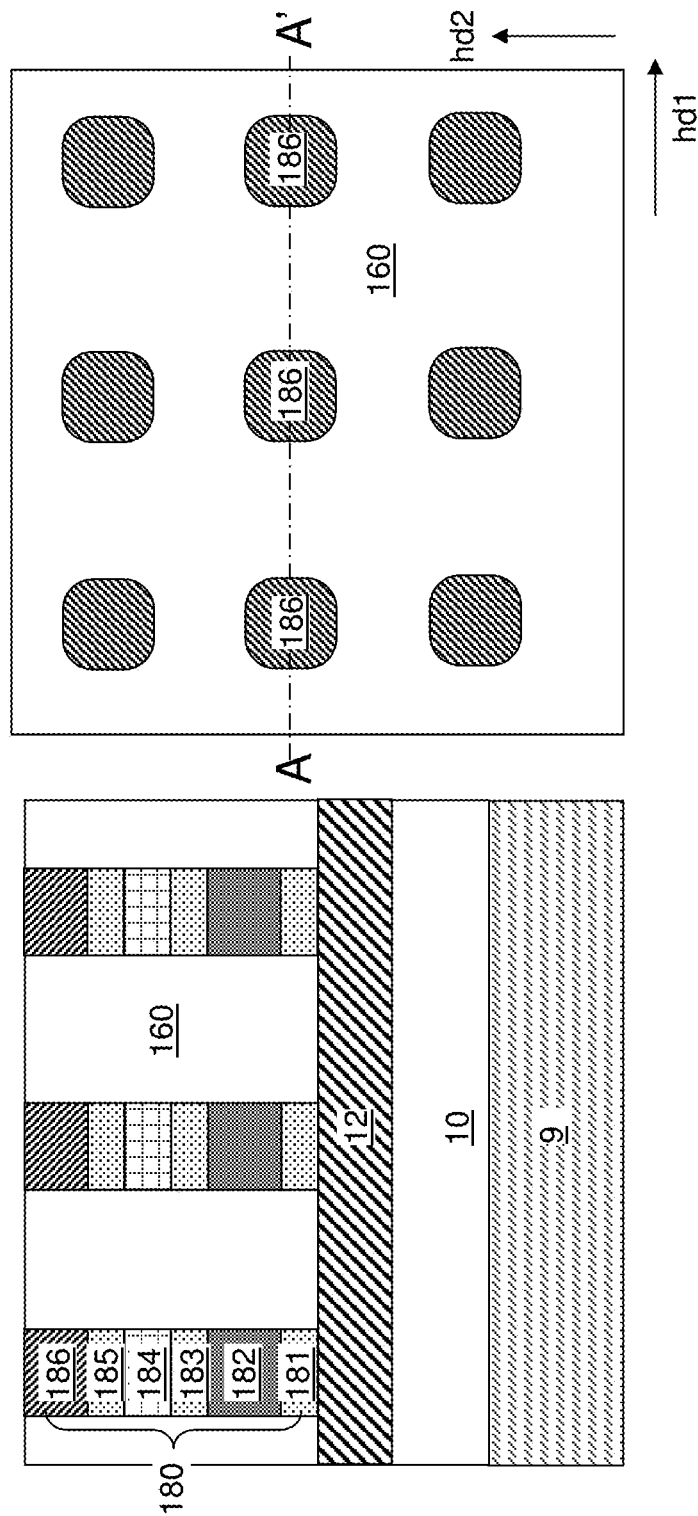
FIG. 4A is a vertical cross-sectional view of the exemplary structure after formation of an isolation material portion including a combination of a dielectric material layer and at least one ovonic threshold switch material portion according to an embodiment of the present disclosure.
FIG. 4B is a top-down view of the exemplary structure of FIG. 4A. The vertical plane A-A' is the plane of the vertical cross-sectional view of FIG. 4A.

Referring to FIGS. 4A and 4B, an isolation material portion 160 is formed by forming at least one ovonic threshold switch material portion, and optionally a dielectric material layer, in the volumes surrounding the two-dimensional array of memory pillar structures 180. The at least one ovonic threshold switch material portion provides thermal isolation between the adjacent memory pillar structures 180. The at least one ovonic threshold switch material portion is present between adjacent memory pillar structures 180 in addition to the selector element 184. If the selector element 184 comprises an OTS element, then the at least one ovonic threshold switch material portion is present between adjacent memory pillar structures 180 in addition to the OTS selector element 184. The dielectric material layer, if present, provides electrical isolation between the adjacent memory pillar structures 180. The materials of the dielectric material layer and the at least one ovonic threshold switch material portion can be deposited after formation of the two-dimensional array of memory pillar structures 180, and excess portions of the materials of the dielectric material layer and the at least one ovonic threshold switch material portion can be removed from above the top surfaces of the two-dimensional array of memory pillar structures 180 by a planarization process such as a chemical mechanical polishing or planarization (CMP) process.

The isolation material portion 160 may include one to five layers of each of the at least one ovonic threshold switch material portion and the dielectric material layer. Generally, the isolation material portion 160 surrounds the two-dimensional array of memory pillar structures 180 such that a segment of the dielectric material layer and a segment of the at least one ovonic threshold switch material portion are located between each laterally-neighboring pair of memory pillar structures 180. The at least one ovonic threshold switch material portion can comprise a compound of at least one Group 14 elements and at least one Group 16 element. In one embodiment, the at least one ovonic threshold switch material portion comprises a material selected from a GeSeAs alloy (e.g., $Ge_{10}As_{35}Se_{55}$), a GeTeAs alloy, a GeSeTe alloy, a GeSe alloy, a SeAs alloy, a AsTe alloy, a GeTe alloy, a SiTe alloy (e.g., $Si_{20}Te_{80}$), a SiAsTe alloy, or SiAsSe alloy. The at least one ovonic threshold switch material portion may be optionally doped with N, O, C, P, Ge, As, Te, Se, In, and/or Si in order to decrease thermal conductivity and to increase a threshold electrical field (i.e., the electrical field above which the material becomes conductive) relative to the material in the selector elements 184. Thus, the at least one ovonic threshold switch material portion in the isolation material portion 160 does not function as an ovonic threshold switch material in the memory device, but functions as an effective thermal insulator material. The dielectric material layer can comprise a material selected from silicon oxide, silicon nitride, organosilicate glass, and dielectric metal oxides. Optionally, the isolation material portion 160 may include an adhesion material layer, such as an amorphous silicon layer.

Referring to FIGS. 5A and 5B, second electrically conductive lines 20 laterally extending along a second horizontal direction hd2 can be formed on top surfaces of the memory pillar structures 180. Each second electrically conductive line 20 can contact top surfaces of a respective subset of the two-dimensional array of memory pillar structures 180. For example, each second electrically conductive line 20 can contact top surfaces of a column of memory pillar structures 180 arranged along the second horizontal direction hd2. In one embodiment, the second electrically conductive lines 20 can be formed by depositing at least one conductive material layer and patterning the at least one conductive material layer into a plurality of line structures that contact a respective column of memory pillar structures 180. In another embodiment, an insulating layer (not shown) can be deposited over the memory pillar structures 180 and the isolation material portion 160, and can be patterned to form line trenches laterally extending along the second horizontal direction. Top surfaces of a column of memory pillar structures 180 can be physically exposed at the bottom of each line trench. At least one conductive material can be deposited in the line trenches and can be subsequently planarized to form the second electrically conductive lines 20. Alternatively, the second electrically conductive lines 20 may be formed first, followed by forming the insulating layer between the second electrically conductive lines 20.

Figure 6B:
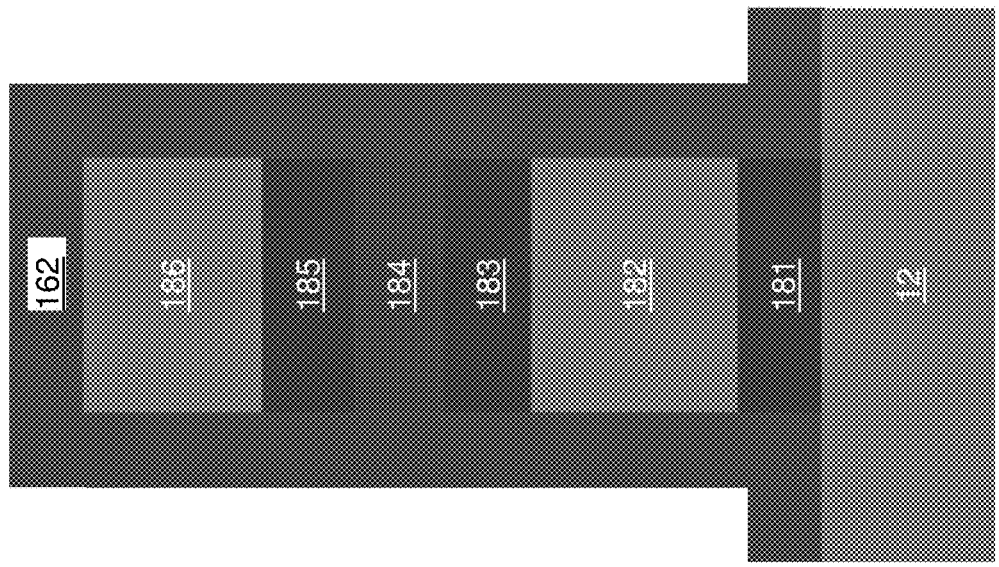
FIGS. 6A-6C are sequential vertical cross-sectional views of a first configuration of the exemplary structure according to an embodiment of the present disclosure.
Figure 6A:
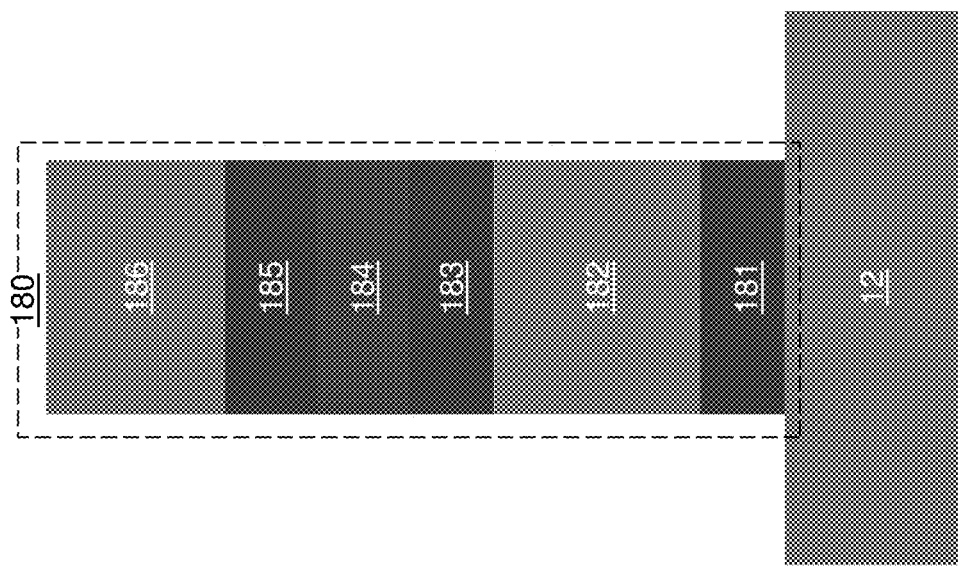

Various configurations may be employed for the isolation material portion 160. FIGS. 6A-6C are sequential vertical cross-sectional views of a first configuration for a memory pillar structure 180 and an isolation material portion 160. Referring to FIG. 6A, a first configuration of the exemplary structure is illustrated after formation of a two-dimensional array of memory pillar structures 180 at the processing steps of FIGS. 3A and 3B.

Referring to FIG. 6B, the at least one ovonic threshold switch material portion is formed as an ovonic threshold switch material layer 162 that contacts all sidewalls of each memory pillar structure 180 within the two-dimensional array of memory pillar structures 180. The ovonic threshold switch material layer 162 can be formed by a conformal deposition process such as chemical vapor deposition (CVD) or atomic layer deposition (ALD). The ovonic threshold switch material layer 162 contacts an entirety of each sidewall of the two-dimensional array of memory pillar structures 180.

The ovonic threshold switch material layer 162 can include any of the materials that can be employed for the at least one ovonic threshold switch material portion as discussed above. The thickness of the ovonic threshold switch material layer 162 is less than one half of the minimum lateral separation distance between neighboring pairs of memory pillar structures 180. For example, the thickness of the ovonic threshold switch material layer 162 can be in a range from 1 nm to 50 nm, such as from 2 nm to 5 nm, although lesser and greater thicknesses can also be employed.

In one optional embodiment, the threshold electrical field for switching between a conductive state and an insulating state for the material of the ovonic threshold switch material layer 162 is greater than the threshold electrical field for the material of the selector element 184. The compositional difference between the material of the ovonic threshold switch material layer 162 and the material of the selector element 184 can be provided by selecting different ovonic threshold switch materials, or by providing different dopants.

Referring to FIG. 6C, a dielectric material layer 164 can be deposited in volumes between vertically protruding portions of the ovonic threshold switch material layer 162. The dielectric material layer 164 includes a dielectric material such as silicon nitride, undoped silicate glass (e.g., silicon oxide), a doped silicate glass (e.g., PSG, BSG or BPSG), an organosilicate glass, spin-on glass, silicon carbide, SiON, SiCN, SiOC, SiOCH, SiOCN, aluminum oxide, tantalum oxide, and/or at least one dielectric metal oxide, nitride or carbide or multilayers of these materials. The dielectric material layer 164 can be deposited by a self-planarizing deposition process, a physical vapor deposition process, or a conformal deposition process. Alternatively, two to five ovonic threshold switch material layers 162 and/or two to five dielectric material layers 164 may be provided between adjacent memory pillar structures 180.

A planarization process can be performed to remove excess portions of the dielectric material layer 164 and the ovonic threshold switch material layer 162 from above a horizontal plane including topmost surfaces of the memory pillar structures 180. The planarization process may be a chemical mechanical planarization (CMP) process. Physically exposed top surfaces of the remaining portions of the ovonic threshold switch material layer 162 and the dielectric material layer 164 can be formed within the horizontal plane including the top surfaces of the memory pillar structures 180. Each ovonic threshold switch material portion 162 that laterally surrounds a respective one of the memory pillar structures 180 comprises a top surface located within the horizontal plane including top surfaces of the two-dimensional array of memory pillar structures 180. The combination of the dielectric material layer 164 and the ovonic threshold switch material layer 162 constitutes the isolation material portion 160.

Figure 6D:
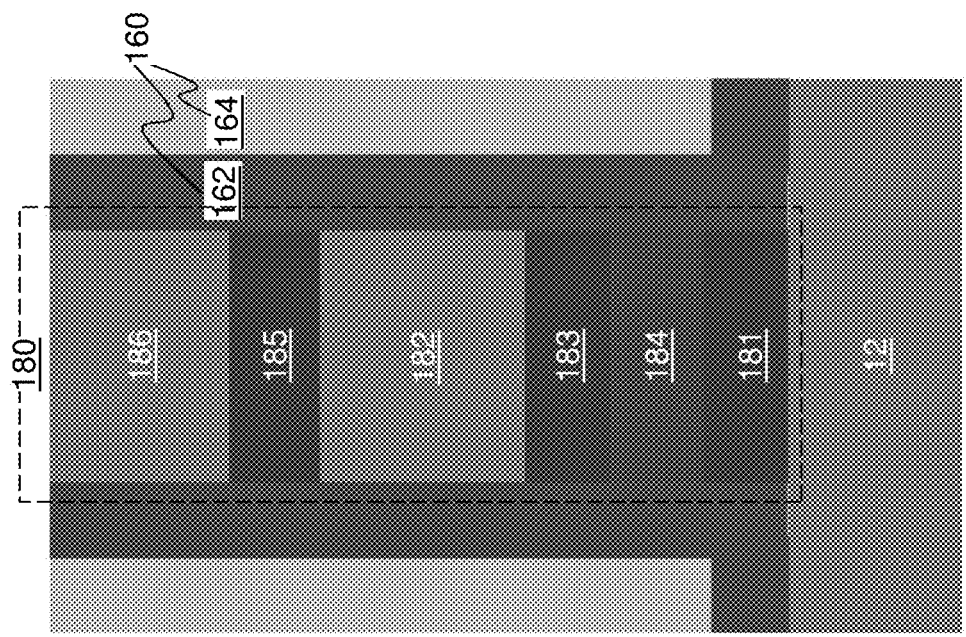
FIG. 6D is a vertical cross-sectional view of a second configuration of the exemplary structure according to an embodiment of the present disclosure.
Figure 6C:
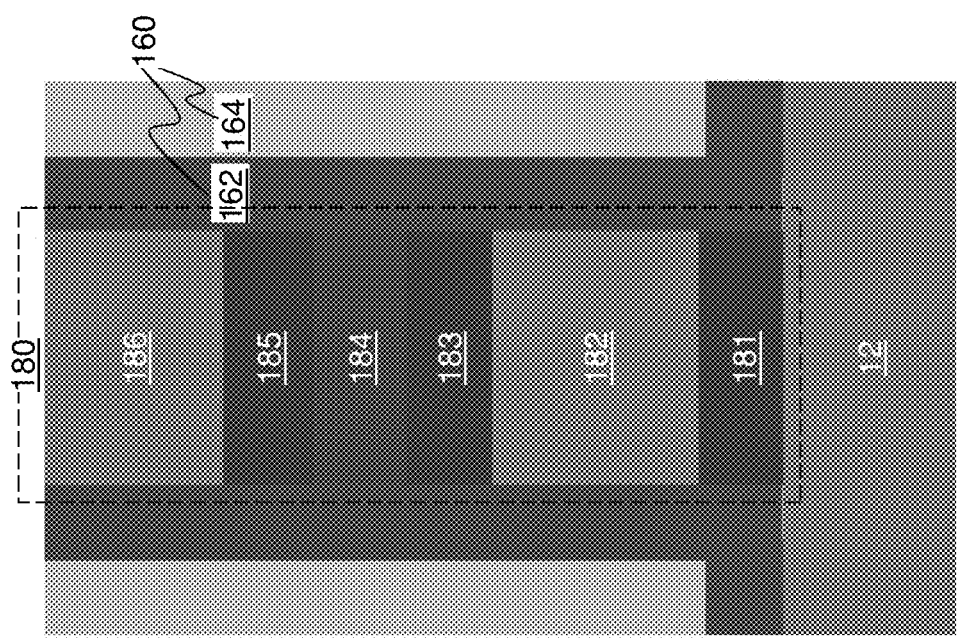

Referring to FIG. 6D, a second configuration of the exemplary structure is illustrated at the processing steps of FIG. 6C. The memory pillar structure 180 in the second configuration can be derived from the first configuration by exchanging the positions of the memory element 182 and the selector element 184. For example, the order of material layers within the material layer stack can be altered at the processing steps of FIGS. 3A and 3B.

Figure 7B:
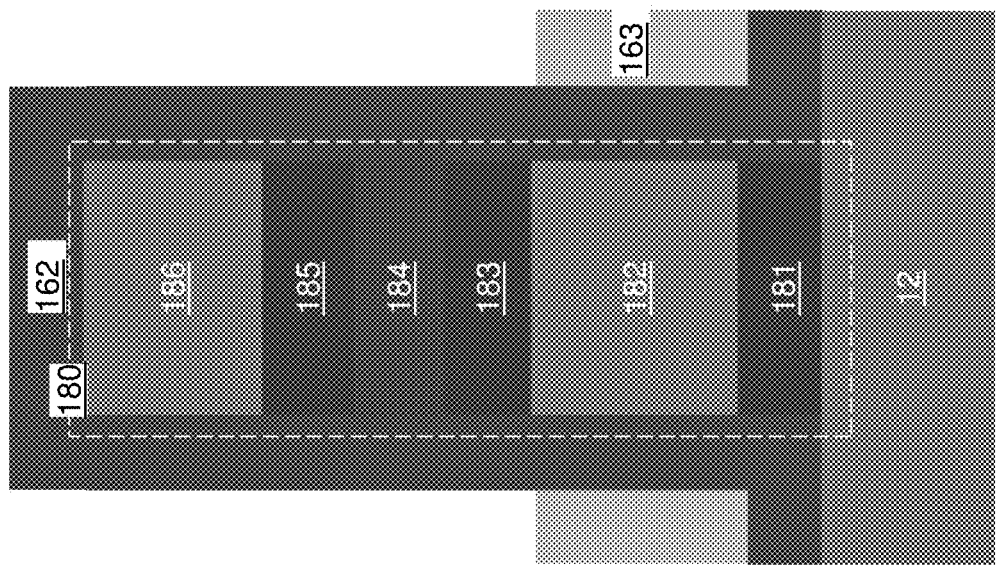
FIGS. 7A-7D are sequential vertical cross-sectional views of a third configuration of the exemplary structure according to an embodiment of the present disclosure.
Figure 7A:
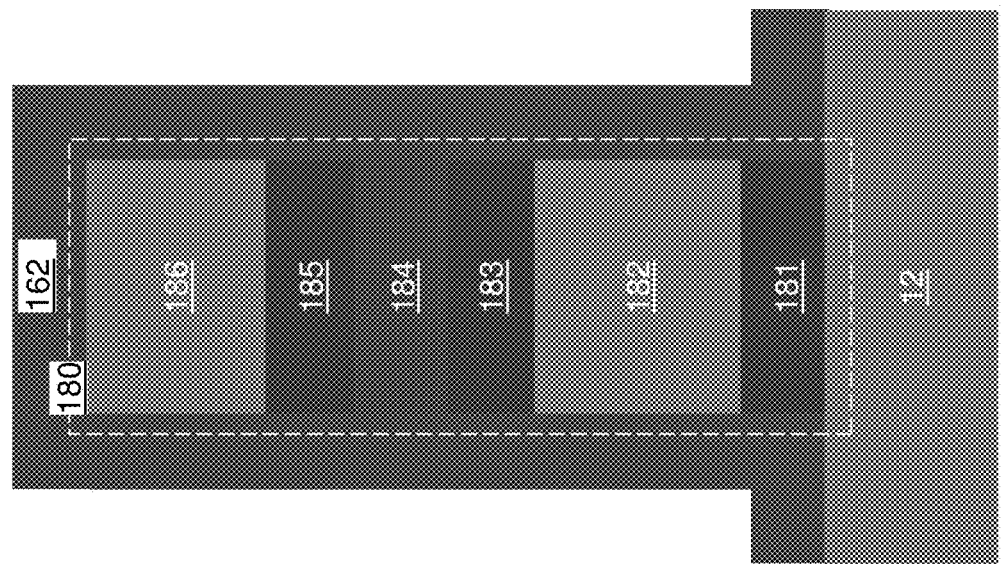

Referring to FIG. 7A, a region including a memory pillar structure 180 in a third configuration is illustrated. The exemplary structure illustrated in FIG. 7A can be the same as the exemplary structure illustrated in FIG. 5A.

Referring to FIG. 7B, a first dielectric material sublayer 163 can be deposited over a horizontal portion of the ovonic threshold switch material layer 162 between neighboring pairs of memory pillar structures 180. As used herein, a "sublayer" refers to a component layer that is present within, or is subsequently incorporated within, a layer. The first dielectric material sublayer 163 includes a self-planarizing dielectric material or a planarizable dielectric material.

For example, the first dielectric material sublayer 163 includes spin-on glass (SOG) that is deposited by spin coating. The amount of dispensation of the spin-on glass at the time of spin coating can be selected such that a planar top surface of the first dielectric material sublayer 163 is formed below the horizontal plane including bottom surfaces of the selector elements 184.

Alternatively or additionally, the first dielectric material sublayer 163 can include a planarizable dielectric material such as undoped silicate glass or a doped silicate glass, and can be deposited by a physical vapor deposition process, such as sputtering. The duration of the deposition process that deposits the planarizable dielectric material is selected such that all voids between neighboring pairs of memory pillar structures 180 under the horizontal plane including the top surfaces of the ovonic threshold switch material layer 162 are filled with the planarizable dielectric material. The planarizable dielectric material can be planarized by chemical mechanical planarization or a recess etch so that portions of the deposited planarizable dielectric material overlying the horizontal plane including the top surfaces of the ovonic threshold switch material layer 162 are removed. A selective recess etch process can be performed to recess the planarizable dielectric material selective to the material of the ovonic threshold switch material layer 162. The planarizable dielectric material is recessed below the horizontal plane including bottom surfaces of the selector elements 184 to provide the first dielectric material sublayer 163. The selective recess etch process can employ a wet etch process or a dry etch process.

Figure 7D:
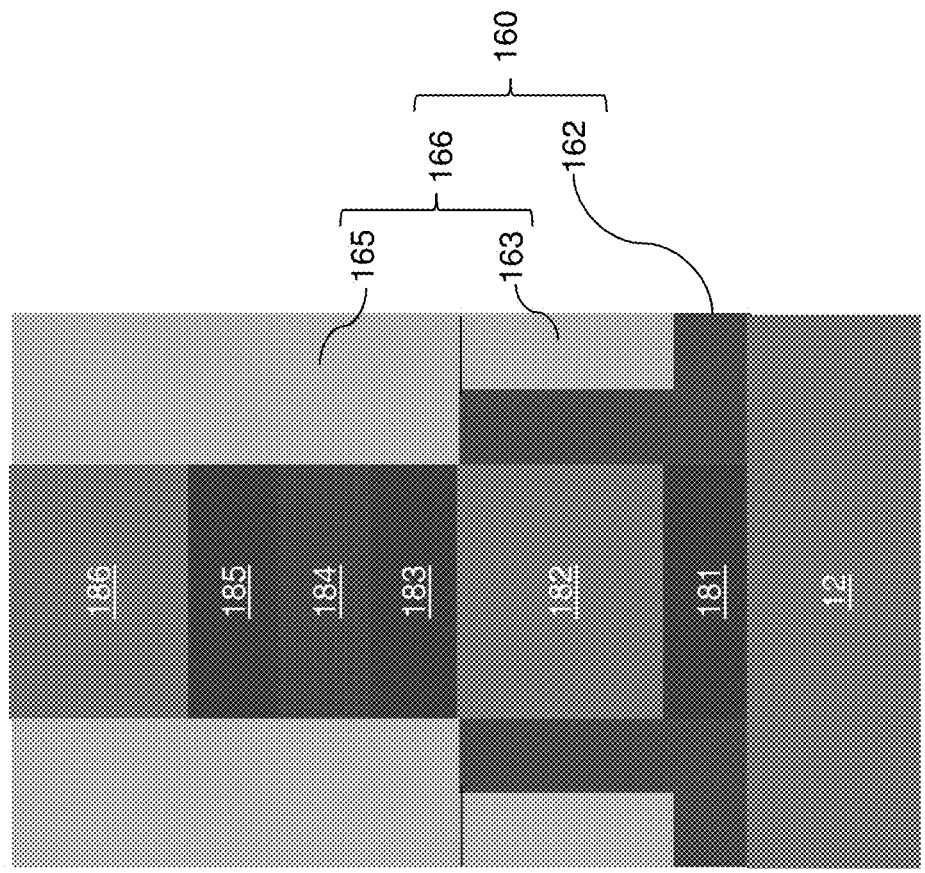
Figure 7C:
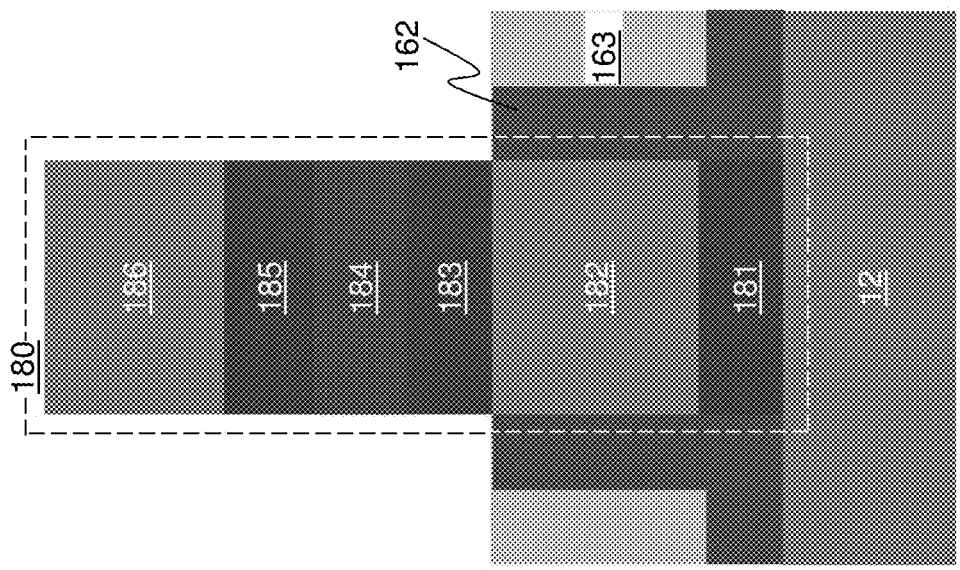

Referring to FIG. 7C, physically exposed portions of the ovonic threshold switch material layer 162 can be removed by performing an isotropic etch process. The isotropic etch process can remove the physically exposed portions of the ovonic threshold switch material layer 162 without significantly etching materials of the memory pillar structures 180. A selective etch process or a timed etch process may be employed to minimize collateral etching of the memory pillar structures 180. Upper regions of sidewalls of the memory pillar structures 180 can be physically exposed by removing portions of the ovonic threshold switch material layer 162.

Referring to FIG. 7D, a second dielectric material sublayer 165 can be deposited directly on the upper regions of the sidewalls of the memory pillar structures 180 and on the top surface of the first dielectric material sublayer 163. The second dielectric material sublayer 165 can be deposited by a self-planarizing deposition process such as spin coating, by a physical vapor deposition process, or by a conformal deposition process such as low pressure chemical vapor deposition. The second dielectric material sublayer 165 can include spin-on glass, undoped silicate glass, or a doped silicate glass. The second dielectric material sublayer 165 may be planarized by performing a planarization process, which can include a recess etch and/or chemical mechanical planarization.

The combination of the first dielectric material sublayer 163 and the second dielectric material sublayer 165 constitutes a dielectric material layer 166. The material of the second dielectric material sublayer 165 may be the same as, or may be different from, the material of the first dielectric material sublayer 163. The combination of the dielectric material layer 166 and the ovonic threshold switch material layer 162 constitutes the isolation material portion 160. The ovonic threshold switch material layer 162 contacts a lower region of each sidewall of the two-dimensional array of memory pillar structures 180, and the dielectric material layer 166 contacts an upper region of each sidewall of the two-dimensional array of memory pillar structures 180. Each ovonic threshold switch material portion comprising a portion of the ovonic threshold switch material layer 162 can include a top surface located below a horizontal plane including top surfaces of the two-dimensional array of memory pillar structures 180. The vertical positions of the memory element 182 and the selector element 184 in each memory pillar structure 180 may be reversed, for example, as illustrated in FIG. 6D.

Referring to FIG. 8A, a vertical cross-sectional view of a memory pillar structure 180 in a fourth configuration is illustrated. The structure illustrated in FIG. 8A can be derived from the structure illustrated in FIG. 6A by depositing a dielectric material layer 164 employing a conformal deposition process, depositing an ovonic threshold switch material layer 162 on the dielectric material layer 164, and planarizing the ovonic threshold switch material layer 162 and the dielectric material layer 164 such that top surfaces of the ovonic threshold switch material layer 162 and the dielectric material layer 164 are coplanar with the top surfaces of the memory pillar structures 180. The dielectric material layer 164 can be formed by depositing a material such as silicon nitride, undoped silicate glass (e.g., silicon oxide), a doped silicate glass (e.g., PSG, BSG or BPSG), an organosilicate glass, spin-on glass, silicon carbide, SiON, SiCN, SiOC, SiOCH, SiOCN, aluminum oxide, tantalum oxide, and/or at least one dielectric metal oxide, nitride or carbide or multilayers of these materials. The thickness of the dielectric material layer 164 can be in a range from 5 nm to 200 nm, such as from 10 nm to 100 nm, although lesser and greater thicknesses can also be employed. In the fourth configuration, the dielectric material layer 164 is formed directly on sidewalls of each memory pillar structure 180 within the two-dimensional array of memory pillar structures 180, and the at least one ovonic threshold switch material portion is formed as an ovonic threshold switch material layer 162 that overlies and surrounds the dielectric material layer 164. In one embodiment, all sidewalls of the selector elements 184 can contact the dielectric material layer 164. Each ovonic threshold switch material portion comprising a portion of the ovonic threshold switch material layer 162) can include a top surface located within a horizontal plane including top surfaces of the two-dimensional array of memory pillar structures 180.

Referring to FIG. 8B, a fifth configuration for the exemplary structure is illustrated, which can be derived from the fourth configuration by exchanging the positions of the memory element 182 and the selector element 184. For example, the order of material layers within the material layer stack can be altered at the processing steps of FIGS. 3A and 3B.

Figure 9A:
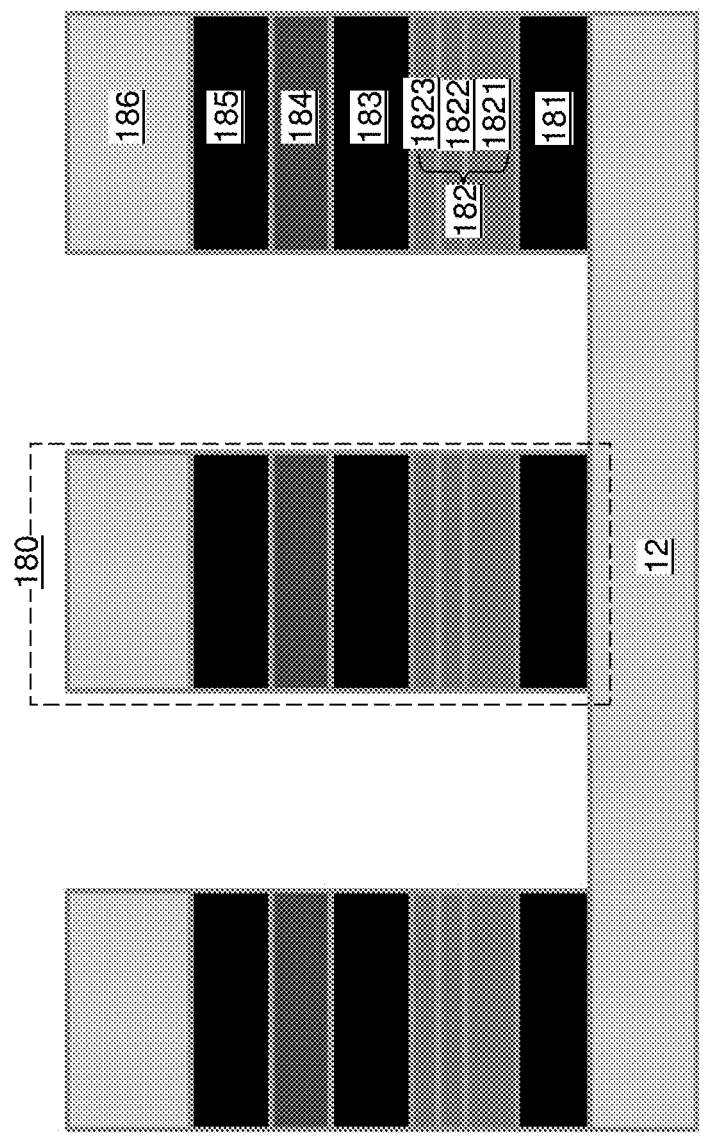
FIGS. 9A-9F are sequential vertical cross-sectional views of a sixth configuration of the exemplary structure according to an embodiment of the present disclosure.

Referring to FIG. 9A, a sixth configuration for the exemplary structure is illustrated, which can be the same as the exemplary structure illustrated in FIG. 6A. In this embodiment, the memory element 182 comprises a MRAM element which includes a ferromagnetic reference layer 1821, such as a CoFeB layer, a ferromagnetic free layer 1823, such as a CoFeB layer, and a tunneling dielectric 1822, such as a MgO layer located between the reference and free layers. The MRAM element may also include additional layers, such as an CoPt multilayer that provides additional perpendicular magnetic anisotropy to the reference layer 1821. The reference layer 1821 can also be comprised of two ferromagnetic layers that are anti-ferromagnetically coupled to reduce the stray magnetic fields on free layer 1823. The vertical positions of the reference and free layers may be reversed.

Figure 9B:
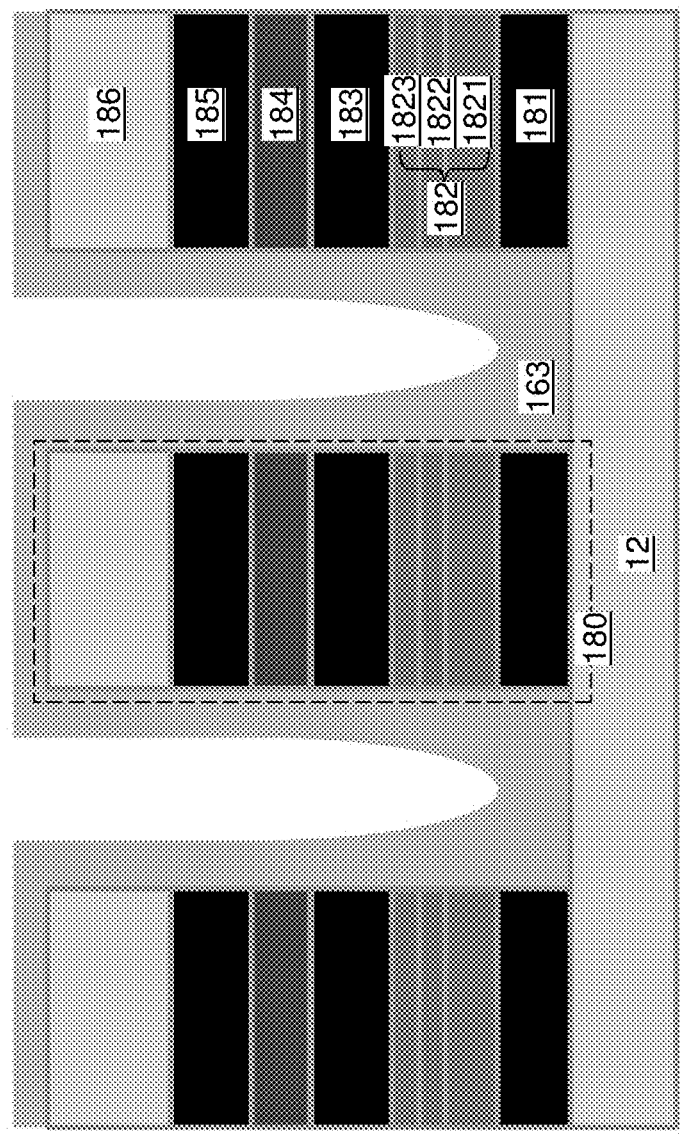

Referring to FIG. 9B, a first dielectric material sublayer 163 can be deposited directly on physically exposed surfaces of the memory pillar structures 180 and directly on physically exposed surfaces of the first electrically conductive lines 12 and the insulating layer 10. The first dielectric material sublayer 163 may be composed of silicon nitride, undoped silicate glass (e.g., silicon oxide), a doped silicate glass (e.g., PSG, BSG or BPSG), an organosilicate glass, spin-on glass, silicon carbide, SiON, SiCN, SiOC, SiOCH, SiOCN, aluminum oxide, tantalum oxide, and/or at least one dielectric metal oxide, nitride or carbide or multilayers of these materials. The first dielectric material sublayer 163 can be deposited by a conformal deposition process, such as atomic layer deposition (ALD). Unfilled cavities (voids) are present between neighboring pairs of memory pillar structures 180 after formation of the first dielectric material sublayer 163. All sidewalls of the memory pillar structures 180 contact the first dielectric material sublayer 163. Accordingly, all sidewalls of the selector elements 184 contact the first dielectric material sublayer 163.

Figure 9C:
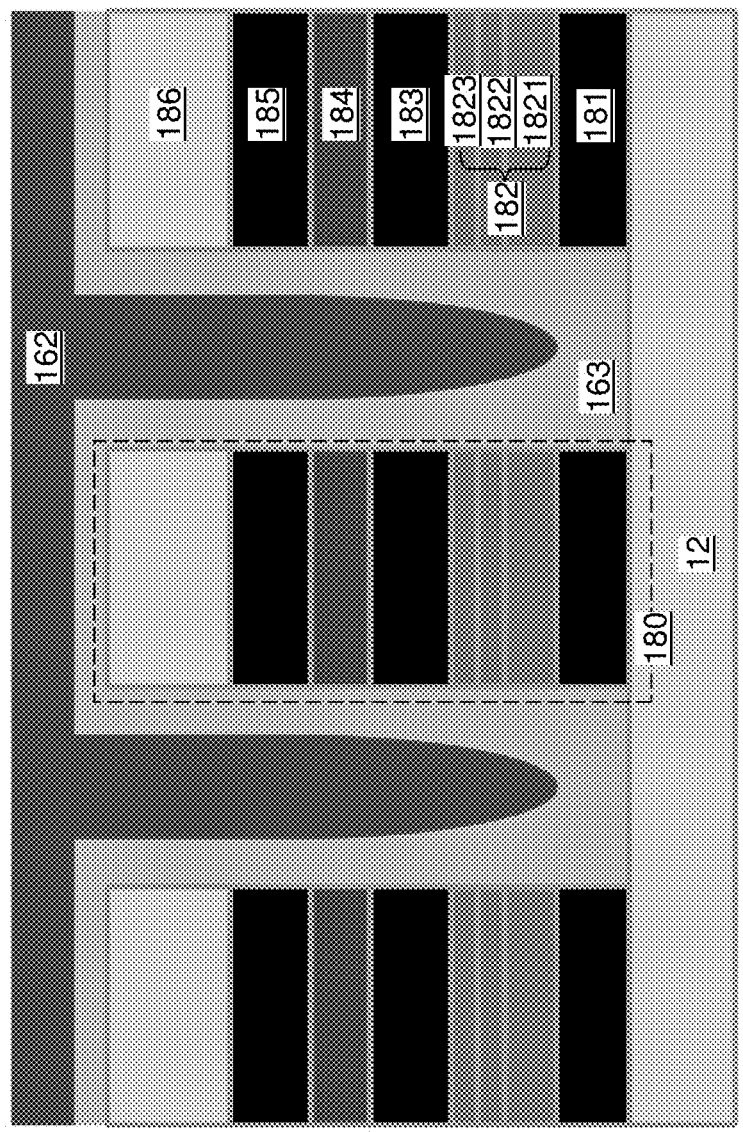

Referring to FIG. 9C, an ovonic threshold switch material layer 162 can be deposited in the voids so that all voids are filled with the ovonic threshold switch material layer 162. In one embodiment, the ovonic threshold switch material layer 162 can be deposited by atomic layer deposition or physical vapor deposition, such as sputtering.

Figure 9D:
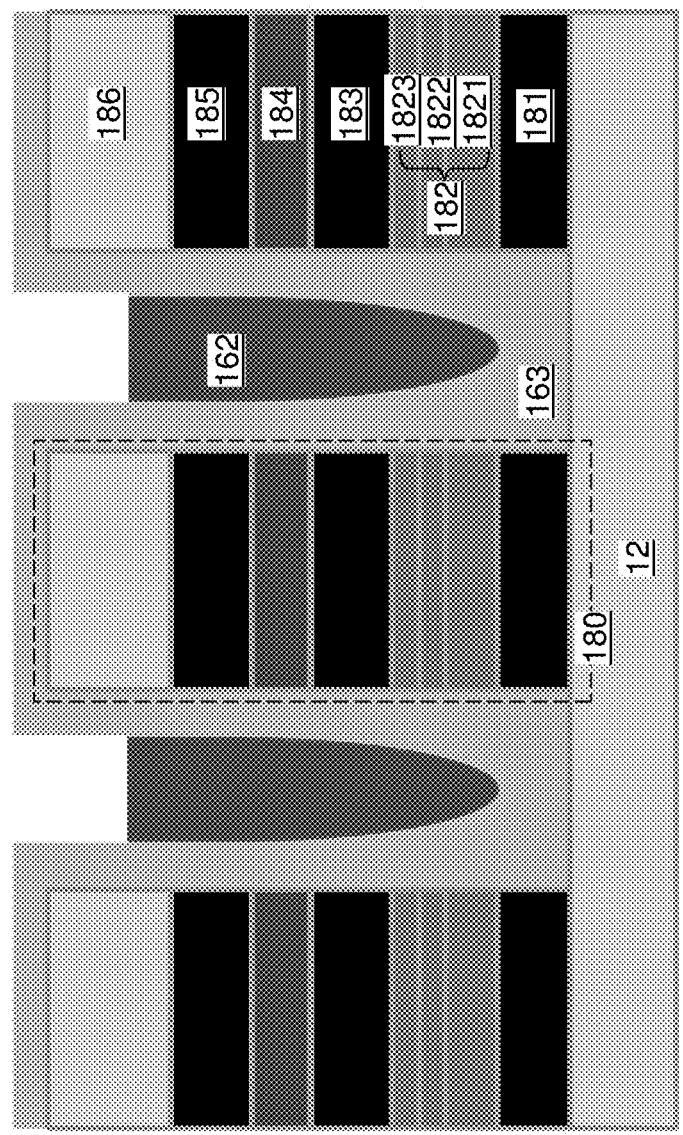

Referring to FIG. 9D, the ovonic threshold switch material layer 162 can be recessed selective to the material of the first dielectric material sublayer 163 by a recess etch process. The recess etch process can employ a wet etch process or a dry etch process (such as a HBr reactive ion etch or a chemical dry etch) or ion beam etching. The ovonic threshold switch material layer 162 can be vertically recessed such that the top surface of the ovonic threshold switch material layer 162 is formed below the horizontal plane including the top surfaces of the memory pillar structures 180.

Figure 9E:
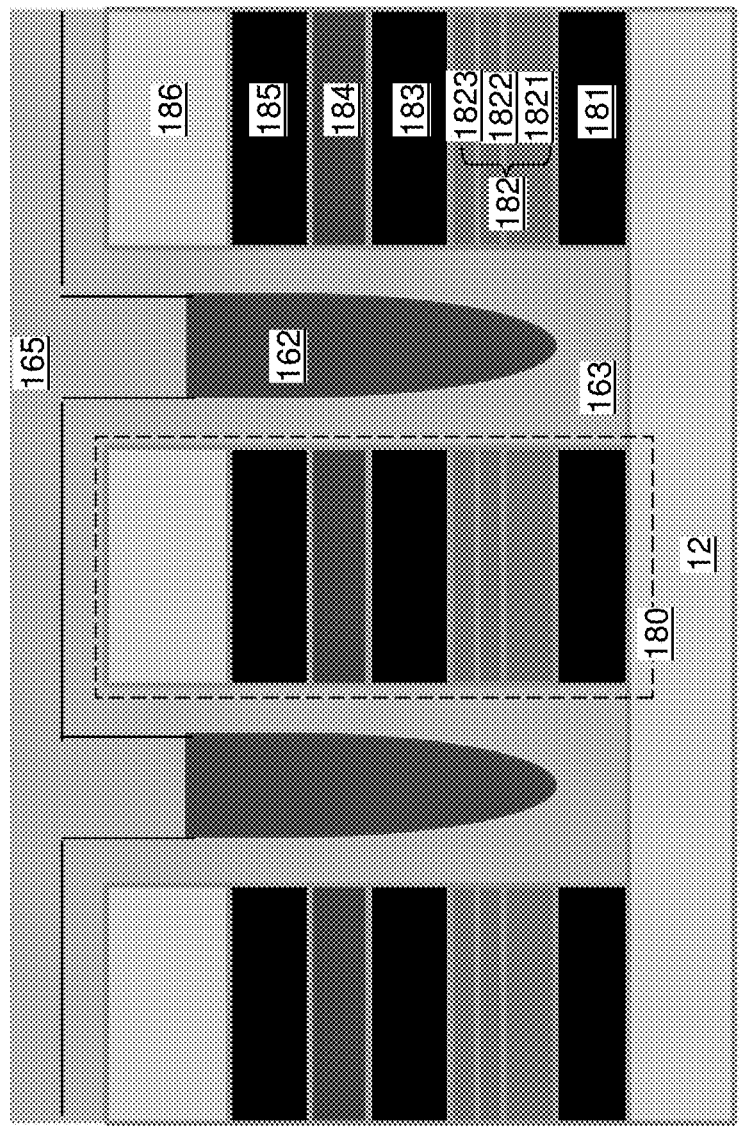

Referring to FIG. 9E, a second dielectric material sublayer 165 can be deposited directly on the top surface of the first dielectric material sublayer 163 and directly on the physically exposed sidewall surfaces and the top surface of the first dielectric material sublayer 163. The second dielectric material sublayer 165 can be deposited by a self-planarizing deposition process such as spin coating, or by a conformal deposition process such as ALD or low pressure chemical vapor deposition. The second dielectric material sublayer 165 can include silicon nitride, undoped silicate glass (e.g., silicon oxide), a doped silicate glass (e.g., PSG, BSG or BPSG), an organosilicate glass, spin-on glass, silicon carbide, SiON, SiCN, SiOC, SiOCH, SiOCN, aluminum oxide, tantalum oxide, and/or at least one dielectric metal oxide, nitride or carbide or multilayers of these materials.

Figure 9F:
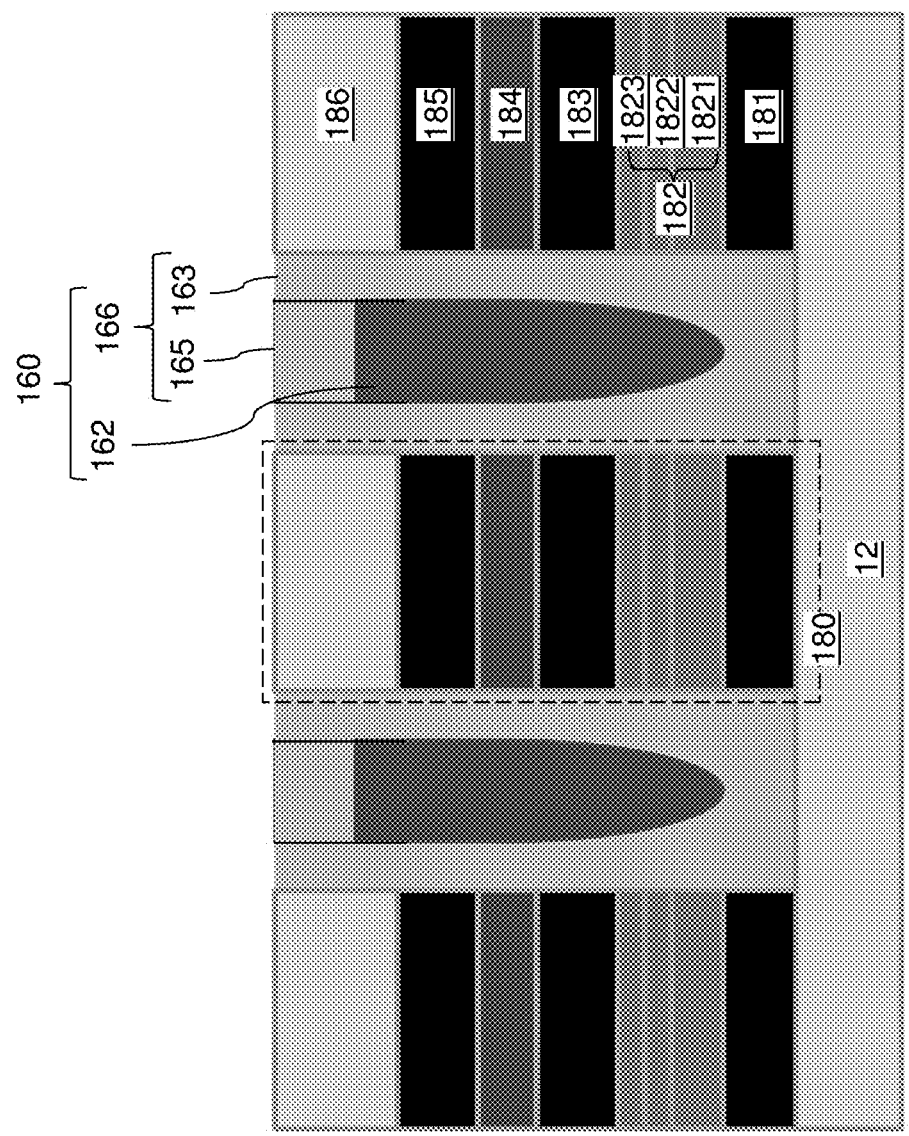

Referring to FIG. 9F, the second dielectric material sublayer 165 may be planarized by performing a planarization process, which can include a recess etch and/or chemical mechanical planarization. The combination of the first dielectric material sublayer 163 and the second dielectric material sublayer 165 constitutes a dielectric material layer 166. The material of the second dielectric material sublayer 165 may be the same as, or may be different from, the material of the first dielectric material sublayer 163. The combination of the dielectric material layer 166 and the ovonic threshold switch material layer 162 constitutes the isolation material portion 160.

The ovonic threshold switch material layer 162 is laterally spaced from each memory pillar structure 180 by a vertically extending portion of the dielectric material layer 166. Each ovonic threshold switch material portion can be encapsulated within the dielectric material layer 166. As used herein, a first element is encapsulated in a second element if a first closed boundary (i.e., a closed two-dimensional surface) that includes all outer surfaces of the first element is located entirely within a second closed boundary that includes all outer surfaces of the second element. In one embodiment, the entirety of the ovonic threshold switch material layer 162 can be encapsulated in the dielectric material layer 166. The dielectric material layer 166 contacts an entirety of each sidewall of the two-dimensional array of memory pillar structures 180. Each ovonic threshold switch material portion comprising a portion of the ovonic threshold switch material layer 162 can comprise a top surface located below a horizontal plane including top surfaces of the two-dimensional array of memory pillar structures 180. In alternative configurations, the vertical order of material portions in each memory pillar structure 180 may be rearranged, for example, as illustrated in FIG. 6D.

Figure 9G:
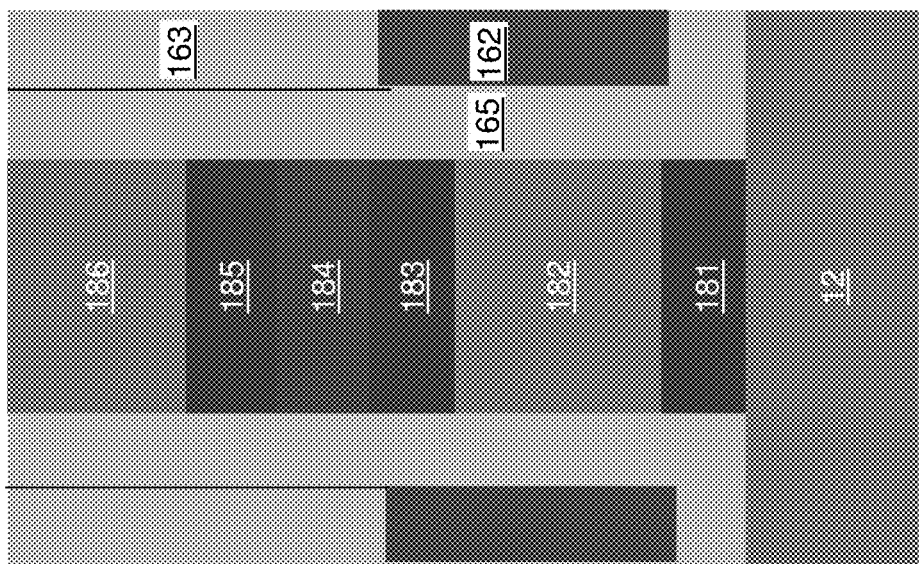
FIG. 9G is a vertical cross-sectional view of an alternative embodiment of the sixth configuration of the exemplary structure according to an embodiment of the present disclosure.

Referring to FIG. 9G, an alternative embodiment of the sixth configuration of the exemplary structure is illustrated, in which the height of the ovonic threshold switch material layer 162 is adjusted so that the top surface of the ovonic threshold switch material layer 162 formed at, or below, the horizontal plane including the bottom surfaces of the selector elements 184.

Second electrically conductive lines 20 can be formed on any of the exemplary structures illustrated in FIGS. 6C, 6D, 7D, 8A, 8B, 9F, and 9G by performing the processing steps illustrated in FIGS. 5A and 5B.

Referring to all drawings and according to various embodiments of the present disclosure, a memory device includes a plurality of memory cells 182, and an isolation material portion 160 located between the memory cells 182. The isolation material portion includes at least one ovonic threshold switch material portion 162.

In one embodiment, the memory device further comprises first electrically conductive lines 12 laterally extending along a first horizontal direction hd1 and located over a substrate 9, a two-dimensional array of memory pillar structures 180 located on the first electrically conductive lines 12, wherein each memory pillar structure 180 comprises a memory cell 182 of the plurality of memory cells 182, and second electrically conductive lines 20 laterally extending along a second horizontal direction hd2 and contacting top surfaces of a respective subset of the two-dimensional array of memory pillar structures 180 (which may be arranged as a column extending along the second horizontal direction hd2).

In one embodiment, the isolation material portion 160 further comprises a dielectric material layer (164 or 166) in addition to the least one ovonic threshold switch material portion which comprises a respective portion of an ovonic threshold switch material layer 162, the isolation material portion 160 surrounds the two-dimensional array of memory pillar structures 180, and a segment of the dielectric material layer (164 or 166) and a segment of the at least one ovonic threshold switch material portion 162 are located between each laterally-neighboring pair of memory pillar structures 180.

In one embodiment, the at least one ovonic threshold switch material portion comprises a compound of at least one Group 14 elements and at least one Group 16 element. In one embodiment, the at least one ovonic threshold switch material portion comprises a material selected from a GeSeAs alloy (e.g., $Ge_{10}As_{35}Se_{55}$), a GeTeAs alloy, a GeSeTe alloy, a GeSe alloy, a SeAs alloy, a AsTe alloy, a GeTe alloy, a SiTe alloy (e.g., $Si_{20}Te_{80}$), a SiAsTe alloy, or SiAsSe alloy.

In one embodiment, the dielectric material layer (164 or 166) comprises a material selected from silicon nitride, undoped silicate glass (e.g., silicon oxide), a doped silicate glass (e.g., PSG, BSG or BPSG), an organosilicate glass, spin-on glass, silicon carbide, SiON, SiCN, SiOC, SiOCH, SiOCN, aluminum oxide, tantalum oxide, and/or at least one dielectric metal oxide, nitride or carbide or multilayers of these materials.

In one embodiment, the at least one ovonic threshold switch material portion comprises an ovonic threshold switch material layer 162 that contacts sidewalls of each memory pillar structure 180 within the two-dimensional array of memory pillar structures 180. In one embodiment, the ovonic threshold switch material layer 162 contacts an entirety of each sidewall of each memory pillar structure 180 in the two-dimensional array of memory pillar structures 180.

In one embodiment, the ovonic threshold switch material layer 162 contacts a lower region of each sidewall of each memory pillar structure 180 in the two-dimensional array of memory pillar structures 180, and the dielectric material layer (164 or 166) contacts an upper region of each sidewall of each memory pillar structure 180 in the two-dimensional array of memory pillar structures 180.

In one embodiment, the dielectric material layer (164 or 166) contacts an entirety of each sidewall of each memory pillar structure 180 in the two-dimensional array of memory pillar structures 180. In one embodiment, the at least one ovonic threshold switch material portion comprises a top surface located within a horizontal plane including top surfaces of the two-dimensional array of memory pillar structures 180. In one embodiment, the at least one ovonic threshold switch material portion is encapsulated within the dielectric material layer 166.

In one embodiment, each memory pillar structure 180 within the two-dimensional array of memory pillar structures 180 comprises the memory cell (i.e., memory element) 182 which comprises a memory material configured to provide at least two different resistivity states representing a respective bit, and a selector element 184.

In one embodiment, the memory cell 182 comprises a phase change material memory element, and the selector element 184 comprises an ovonic threshold voltage material provided in addition to the at least one ovonic threshold switch material portion 162 of the isolation material portion 160. In one embodiment, all sidewalls of the selector element 184 contact the dielectric material layer (164 or 166). In one embodiment, the selector element 184 comprises a first ovonic threshold switch material and contacts a respective one of the at least one ovonic threshold switch material portion, and each of the at least one ovonic threshold switch material portion comprises a second ovonic threshold switch material portion having a higher threshold electrical field than the first ovonic threshold switch material.

In one embodiment shown in FIG. 9E, the memory cell 182 comprises a magnetoresistive random access memory element comprising a tunneling dielectric 1822 located between a ferromagnetic free layer 1823 and a ferromagnetic reference layer 1821. In another embodiment, the memory cell 182 comprises a resistive random access memory element comprising a metal oxide layer.

The various configurations for the isolation material portion 160 can be employed to provide enhanced electrical isolation and thermal isolation between each neighboring pair of memory pillar structures 180, thereby reducing or eliminating thermal interference between neighboring pairs of memory pillar structures 180 during operation of the memory array. Device characteristics of neighboring memory pillar structures 180 are affected less by enhanced thermal insulation provided by the ovonic threshold switch material, which can function as a better thermal insulator material than the material of the dielectric material layer (164 or 166) (such as undoped silicate glass, doped silicate glass, SOG, and/or a dielectric metal oxide). The dielectric material layer (164 or 166) provides superior electrical isolation and greater mechanical strength to the memory device than the ovonic threshold switch material. Thus, the isolation material portion 160 can provide an optimal combination of electrical isolation and thermal isolation as well as suitable mechanical support to a memory array.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device, comprising:
a plurality of memory cells;
an isolation material portion located between the plurality of memory cells, wherein the isolation material portion comprises at least one ovonic threshold switch material portion;
first electrically conductive lines laterally extending along a first horizontal direction and located over a substrate;
a two-dimensional array of memory pillar structures located on the first electrically conductive lines, wherein each memory pillar structure of the two-dimensional array of memory pillar structures comprises a memory cell of the plurality of memory cells; and
second electrically conductive lines laterally extending along a second horizontal direction and contacting top surfaces of a respective subset of the two-dimensional array of memory pillar structures;
wherein:
the isolation material portion further comprises a dielectric material layer in addition to the least one ovonic threshold switch material portion;
the isolation material portion surrounds the two-dimensional array of memory pillar structures;
a segment of the dielectric material layer and a segment of the at least one ovonic threshold switch material portion are located between each laterally-neighboring pair of memory pillar structures;
the at least one ovonic threshold switch material portion comprises a compound of at least one Group 14 elements and at least one Group 16 element; and
the at least one ovonic threshold switch material portion comprises an ovonic threshold switch material layer that contacts sidewalls of each memory pillar structure of the two-dimensional array of memory structures.

2. The memory device of claim 1, wherein the at least one ovonic threshold switch material portion comprises a material selected from a GeSeAs alloy, a GeTeAs alloy, a GeSeTe alloy, a GeSe alloy, a SeAs alloy, a AsTe alloy, a GeTe alloy, a SiTe alloy, a SiAsTe alloy, or SiAsSe alloy, and wherein the at least one ovonic threshold switch material portion is undoped or doped with at least one of N, 0, C, P, Ge, As, Te, Se, In, or Si.

3. The memory device of claim 1, wherein the dielectric material layer comprises silicon nitride, undoped silicate glass, a doped silicate glass, an organosilicate glass, spin-on glass, silicon carbide, SiON, SiCN, SiOC, SiOCH, SiOCN, aluminum oxide, tantalum oxide, a dielectric metal nitride, or a dielectric metal carbide, or multilayers thereof.

4. The memory device of claim 1, wherein the ovonic threshold switch material layer contacts an entirety of sidewalls of each memory pillar structure of the two-dimensional array of memory structures.

5. The memory device of claim 1, wherein:
the ovonic threshold switch material layer contacts a lower region of each sidewall of each memory pillar structure of the two-dimensional array of memory structures; and
the dielectric material layer contacts an upper region of each sidewall of each memory pillar structure of the two-dimensional array of memory structures.

6. The memory device of claim 1, wherein the dielectric material layer contacts an entirety of each sidewall of each memory pillar structure.

7. The memory device of claim 6, wherein the at least one ovonic threshold switch material portion comprises a top surface located within a horizontal plane including top surfaces of the two-dimensional array of memory pillar structures.

8. The memory device of claim 6, wherein the at least one ovonic threshold switch material portion is encapsulated within the dielectric material layer.

9. The memory device of claim 1, wherein each memory pillar structure of the two-dimensional array of memory structures comprises:
the memory cell of the plurality of memory cells comprising a memory material configured to provide at least two different resistivity states; and
a selector element.

10. The memory device of claim 9, wherein:
the memory cell of the plurality of memory cells comprises a phase change material; and
the selector element comprises an additional ovonic threshold voltage material that is provided in addition to the at least one ovonic threshold switch material portion of the isolation material portion.

11. The memory device of claim 9, wherein the memory cell of the plurality of memory cells comprises a magnetoresistive random access memory element comprising a tunneling dielectric located between a ferromagnetic free layer and a ferromagnetic reference layer.

12. The memory device of claim 9, wherein the memory cell of the plurality of memory cells comprises a resistive random access memory element comprising a metal oxide layer.

* * * * *